United States Patent
Yoshitake et al.

(10) Patent No.: US 12,134,717 B2
(45) Date of Patent: *Nov. 5, 2024

(54) CURABLE SILICONE COMPOSITION AND CURED PRODUCT OF SAME, MULTILAYER BODY AND METHOD FOR PRODUCING SAME, AND OPTICAL DEVICE OR OPTICAL DISPLAY

(71) Applicant: DOW TORAY CO., LTD., Tokyo (JP)

(72) Inventors: Makoto Yoshitake, Ichihara (JP); Atsushi Sugie, Ichihara (JP); Takuya Ogawa, Ichihara (JP); Michitaka Suto, Ichihara (JP); Haruhiko Furukawa, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 641 days.

This patent is subject to a terminal disclaimer.

(21) Appl. No.: 17/285,744

(22) PCT Filed: Oct. 15, 2019

(86) PCT No.: PCT/JP2019/040432
§ 371 (c)(1),
(2) Date: Apr. 15, 2021

(87) PCT Pub. No.: WO2020/080350
PCT Pub. Date: Apr. 23, 2020

(65) Prior Publication Data
US 2022/0025235 A1 Jan. 27, 2022

(30) Foreign Application Priority Data
Oct. 18, 2018 (JP) ................... 2018-196663

(51) Int. Cl.
*C09J 183/04* (2006.01)
*B32B 7/12* (2006.01)
(Continued)

(52) U.S. Cl.
CPC ............ *C09J 183/04* (2013.01); *B32B 7/12* (2013.01); *B32B 17/06* (2013.01); *B32B 37/12* (2013.01);
(Continued)

(58) Field of Classification Search
CPC ........ C08G 77/12; C08G 77/08; C08G 77/20; G02B 1/04; G02F 1/13338;
(Continued)

(56) References Cited

U.S. PATENT DOCUMENTS 4,413,636 A * 11/1983 Jasso .................. A61N 1/056
607/122
6,235,862 B1 5/2001 Isshiki et al.
(Continued)

FOREIGN PATENT DOCUMENTS

CN 102190890 A 9/2011
CN 101824222 B 8/2012
(Continued)

OTHER PUBLICATIONS

Machine translation of JP2011-162714 retrieved Jan. 16, 2024.*
(Continued)

*Primary Examiner* — Michael B Nelson
(74) *Attorney, Agent, or Firm* — WARNER NORCROSS + JUDD LLP

(57) ABSTRACT

Provided is a curable silicone composition, a cured product thereof, a laminate body, a manufacturing method thereof, and an optical device or optical display exhibiting excellent performance for use as a member where transparency is required such as for an optical display, a touch panel, or the like. A curable silicone composition, comprises: (A) an organopolysiloxane having in a molecule at least 2 alkenyl groups with 2 to 12 carbon atoms; (B) an organohydrogenpolysiloxane having at least 2 silicon-bonded hydrogen
(Continued)

atoms per molecule; and (C) a hydrosilylation reaction catalyst. Component (B) is present in an amount such that the silicon-bonded hydrogen atoms in component (B) are 0.5 to 2 mol per mol of aliphatic unsaturated carbon-carbon bonds in component (A), and 2 to 17.5 mol % of the silicon-bonded organic groups in the curable silicone composition are aryl groups.

20 Claims, 8 Drawing Sheets

(51) Int. Cl.
  *B32B 17/06* (2006.01)
  *B32B 37/12* (2006.01)
  *C09J 5/00* (2006.01)
  *H01L 33/56* (2010.01)
(52) U.S. Cl.
  CPC ............... *C09J 5/00* (2013.01); *H01L 33/56* (2013.01); *B32B 2037/1253* (2013.01); *B32B 2307/412* (2013.01); *B32B 2310/08* (2013.01); *B32B 2457/20* (2013.01); *C09J 2483/00* (2013.01); *H01L 2933/005* (2013.01)
(58) Field of Classification Search
  CPC ........... G02F 1/133602; B32B 2250/24; B32B 9/045; B32B 27/08; B32B 2270/00; B32B 2307/41; B32B 2307/412; B32B 2457/202; B32B 2457/204; B32B 9/005; B32B 27/281; B32B 27/302; B32B 2250/02; B32B 2457/206; B32B 2457/208; B32B 7/12; B32B 17/10; B32B 27/16; B32B 27/285; B32B 27/288; B32B 27/304; B32B 27/306; B32B 27/308; B32B 27/32; B32B 27/325; B32B 27/34; B32B 27/36; B32B 27/365; B32B 27/38; B32B 7/023; B32B 37/12; B32B 2037/1253; B32B 2457/20; H01L 24/73; H01L 2224/45144; H01L 24/32; H01L 24/45; H01L 2224/32245; H01L 2224/48247; H01L 2924/12041; H01L 25/0753; H01L 33/56; H01L 2224/48091; H01L 2224/73265; H01L 2924/181; H01L 2933/005; C03C 27/06; C03C 27/10; C08L 83/04; C08L 2205/025; C08K 5/5415; C09J 5/00; C09J 183/04
  See application file for complete search history.

(56) References Cited

U.S. PATENT DOCUMENTS

| | | | |
|---|---|---|---|
| 2005/0006794 A1 | 4/2005 | Kashigawa et al. | |
| 2006/0270792 A1 | 11/2006 | Kashigawa | |
| 2007/0166470 A1 | 7/2007 | Kashiwagi | |
| 2008/0015326 A1 | 1/2008 | Kodama et al. | |
| 2009/0270542 A1* | 10/2009 | Takuman | C09K 3/1018 524/425 |
| 2010/0224906 A1 | 9/2010 | Kashiwagi et al. | |
| 2011/0269918 A1 | 11/2011 | Hamamoto et al. | |
| 2013/0161683 A1 | 6/2013 | Hamamoto et al. | |
| 2015/0069456 A1 | 3/2015 | Miyamoto et al. | |
| 2015/0274938 A1 | 10/2015 | Okawa et al. | |
| 2015/0299543 A1 | 10/2015 | Miyamoto | |
| 2016/0215141 A1* | 7/2016 | Chon | C08K 5/56 |
| 2016/0280938 A1 | 9/2016 | Miyamoto et al. | |
| 2017/0121462 A1* | 5/2017 | Fujisawa | C08G 77/20 |
| 2017/0226392 A1 | 8/2017 | Luong et al. | |
| 2017/0261893 A1 | 9/2017 | Kinuta | |
| 2020/0071580 A1 | 3/2020 | Ogawa et al. | |
| 2020/0347229 A1 | 11/2020 | Fujisawa et al. | |

FOREIGN PATENT DOCUMENTS

| | | | |
|---|---|---|---|
| CN | 104204100 A | | 12/2014 |
| CN | 106189251 A | | 12/2016 |
| EP | 3130632 A1 | | 2/2017 |
| EP | 3190156 A1 | | 7/2017 |
| JP | H0753872 A | | 2/1995 |
| JP | H08134358 A | | 5/1996 |
| JP | H08 134358 | * | 12/1996 |
| JP | H1012546 A | | 1/1998 |
| JP | H1112546 A | | 1/1999 |
| JP | 2005042099 A | | 2/2005 |
| JP | 2006335857 A | | 12/2006 |
| JP | 2007002234 A | | 1/2007 |
| JP | 2007191504 A | | 8/2007 |
| JP | 2008019385 A | | 1/2008 |
| JP | 2009173789 A | | 8/2009 |
| JP | 2011162714 A | | 8/2011 |
| JP | 2011-162714 | * | 12/2011 |
| JP | 2011246693 A | | 12/2011 |
| JP | 2012111850 A | | 6/2012 |
| JP | 2013129792 A | | 7/2013 |
| JP | 2016534162 A | | 11/2016 |
| JP | 2017161779 A | | 9/2017 |
| WO | WO 99/20705 | * | 12/1999 |
| WO | 2014088115 A1 | | 6/2014 |
| WO | 2015056725 A1 | | 4/2015 |
| WO | 2018043270 A1 | | 3/2018 |
| WO | 2018159725 A1 | | 9/2018 |

OTHER PUBLICATIONS

Machine translation of JP H08 134358 retrieved Jan. 16, 2024.*
Machine assisted English translation of CN102190890A obtained from https://patents.google.com/patent on Jul. 28, 2022, 17 pages.
Machine assisted English translation of CN106189251A obtained from https://patents.google.com/patent on Mar. 15, 2023, 15 pages.
Machine assisted English translation of JP2011162714A obtained from https://worldwide.espacenet.com/patent on Jun. 6, 2023, 23 pages.
English translation of International Search Report for PCT/JP2019/040432 dated Jan. 7, 2020, 2 pages.
Machine assisted English translation of JPH0753872A obtained from https://patents.google.com/patent on Jul. 14, 2021, 8 pages.
Machine assisted English translation of JPH08134358A obtained from https://patents.google.com/patent on Jul. 14, 2021, 8 pages.
Machine assisted English translation of JPH1012546A obtained from https://patents.google.com/patent on Jul. 14, 2021, 5 pages.
Machine assisted English translation of JP2005042099A obtained from https://patents.google.com/patent on Jul. 14, 2021, 13 pages.
Machine assisted English translation of JP2006335857A obtained from https://patents.google.com/patent on Jul. 14, 2021, 10 pages.
Machine assisted English translation of JP2007002234A obtained from https://patents.google.com/patent on Jul. 14, 2021, 9 pages.
Machine assisted English translation of JP2009173789A obtained from https://patents.google.com/patent on Jul. 14, 2021, 11 pages.
Machine assisted English translation of JP2012111850A obtained from https://patents.google.com/patent on Jul. 14, 2021, 13 pages.

* cited by examiner

[FIG. 1]
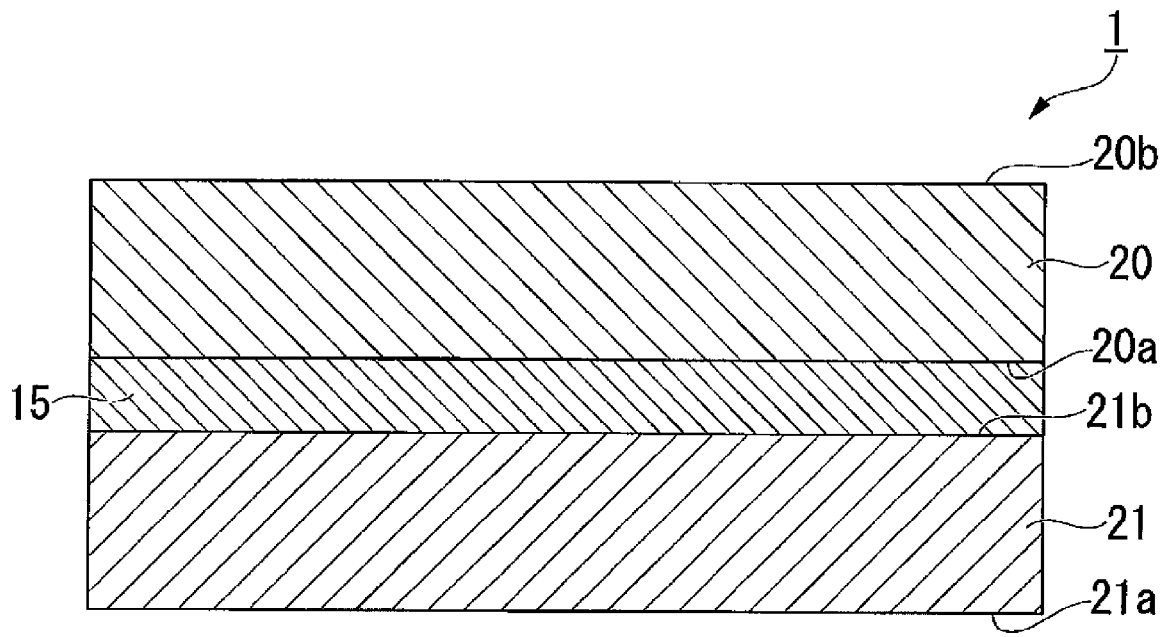
[FIG. 2]
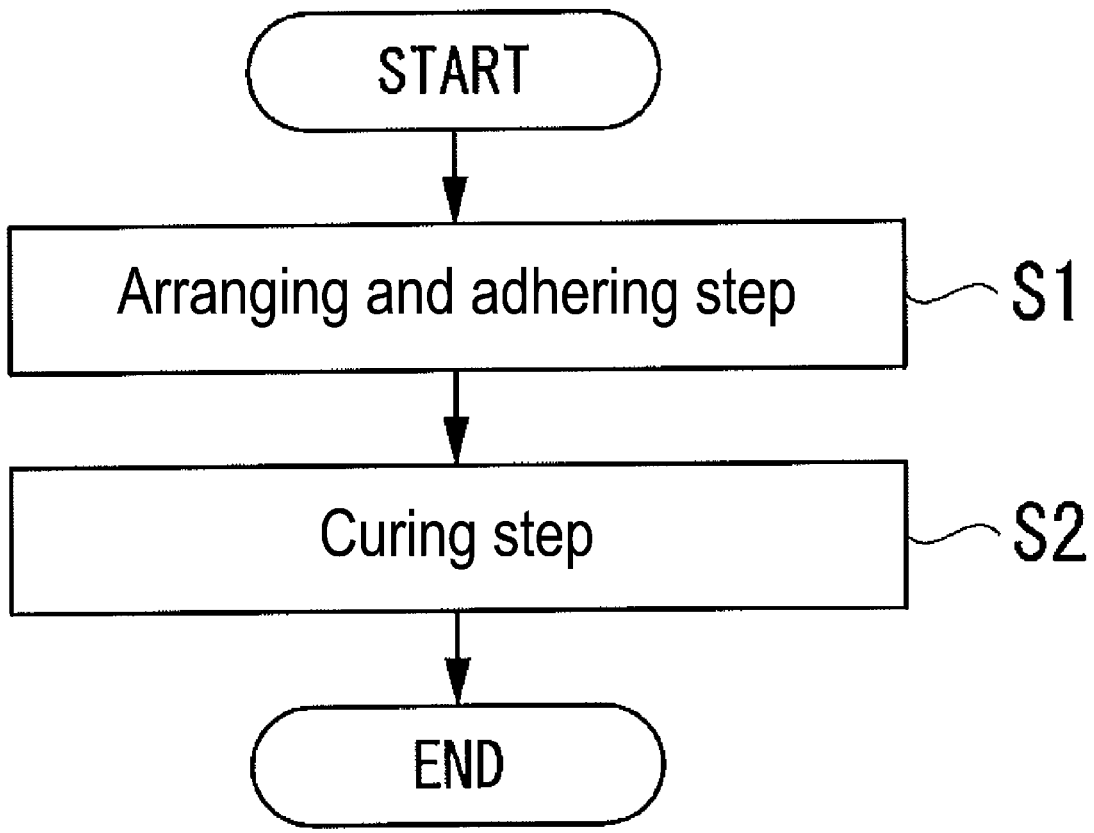

[FIG. 3]
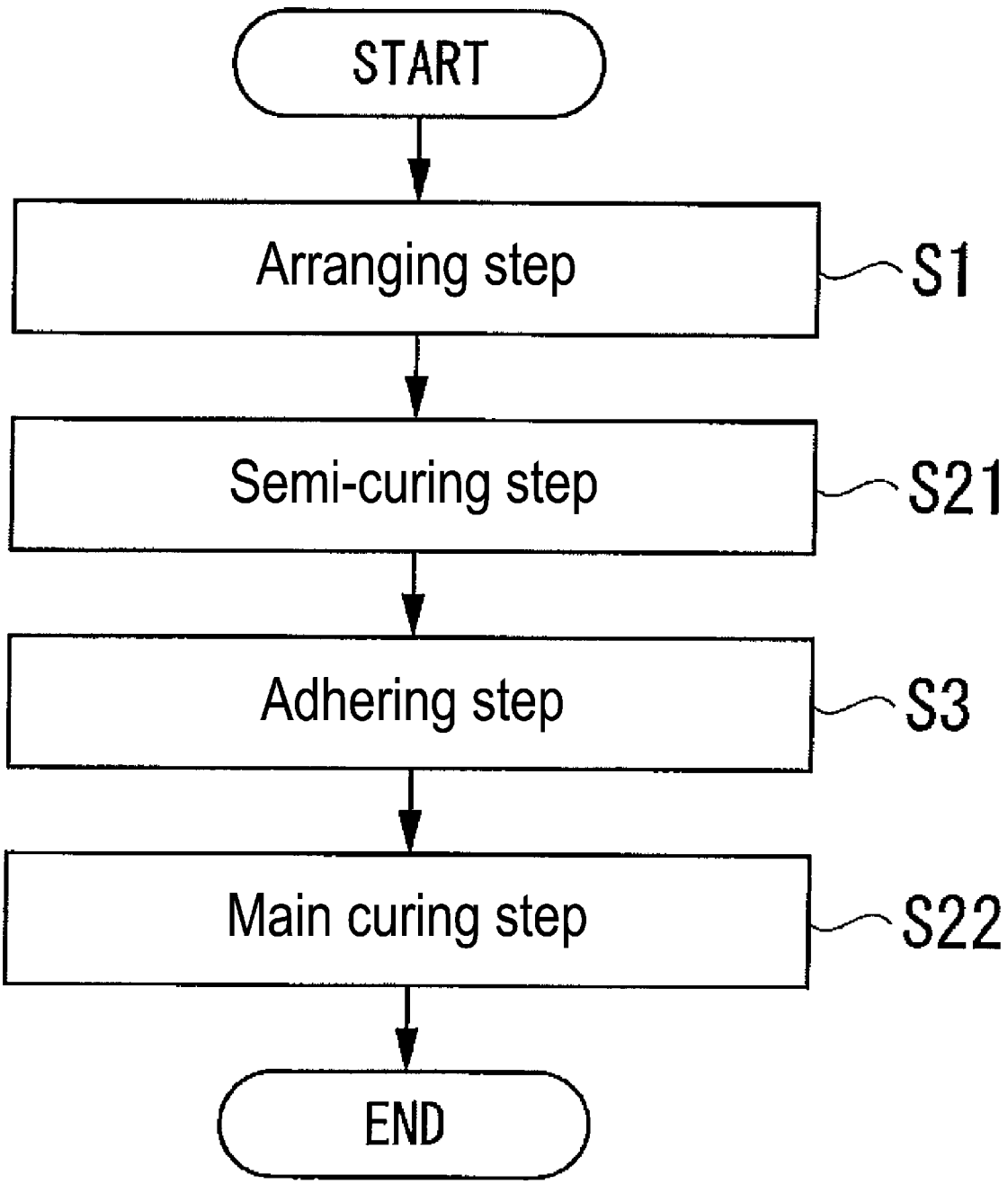

[FIG. 4]
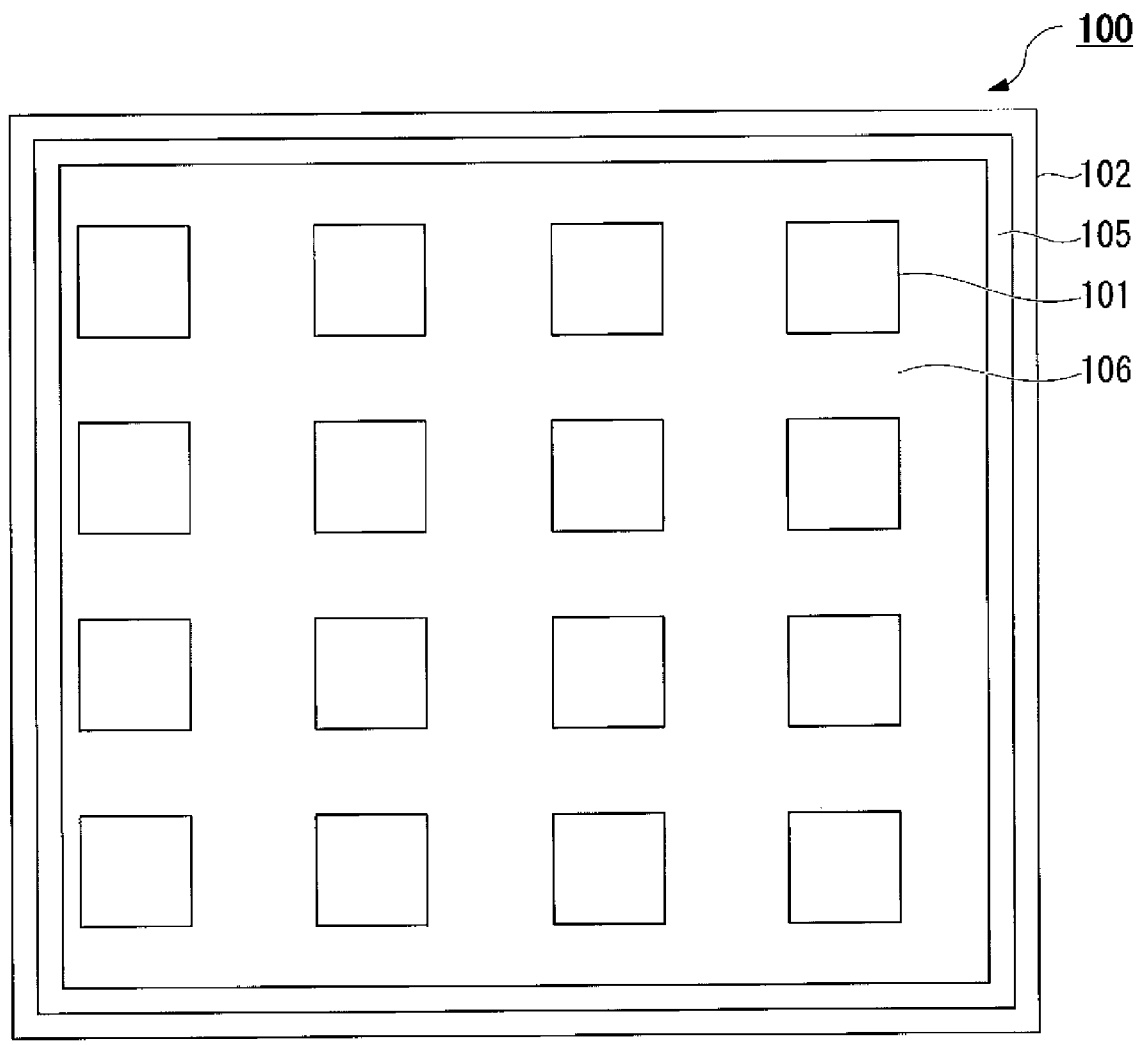
[FIG. 5]
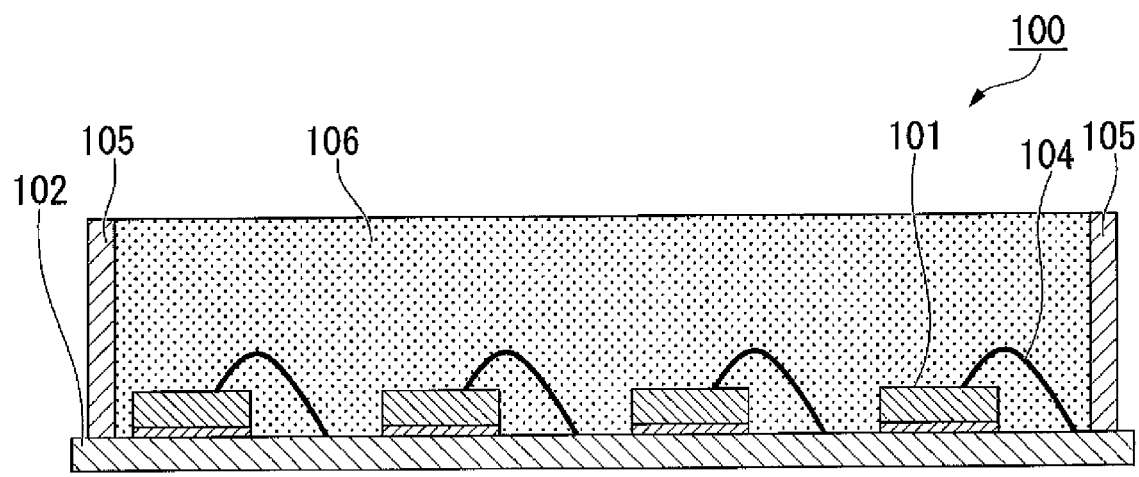

[FIG. 6]
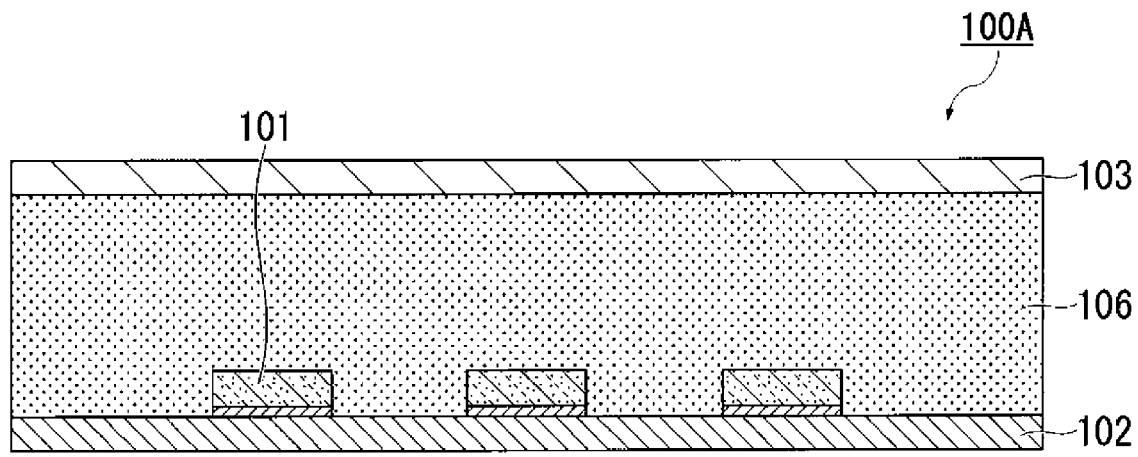
[FIG. 7]
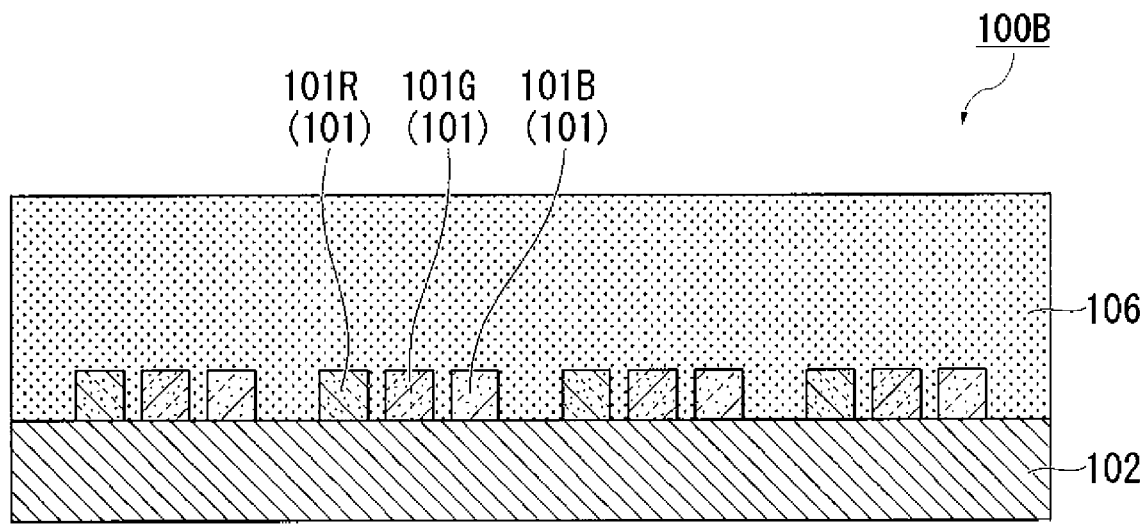

[FIG. 8]
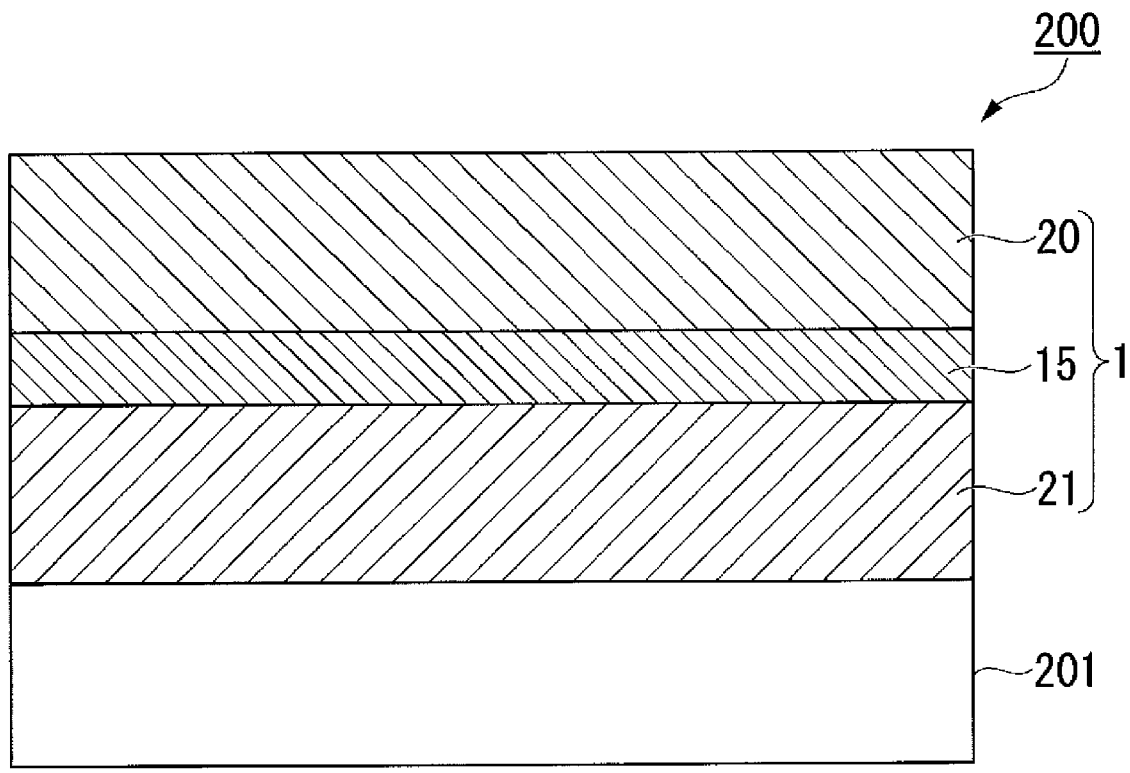
[FIG. 9]
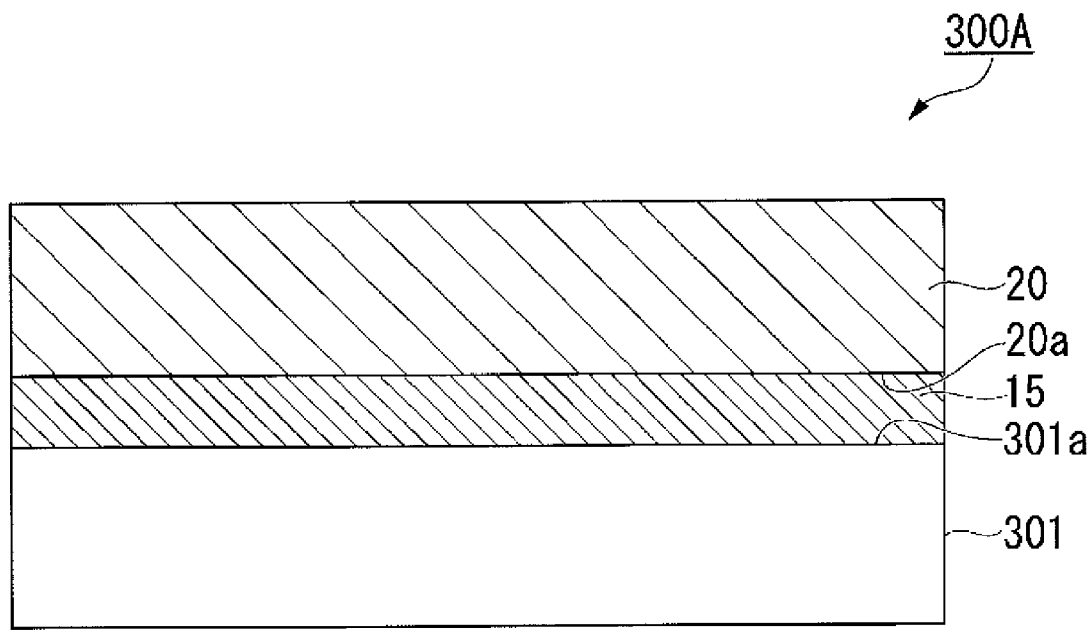

[FIG. 10]
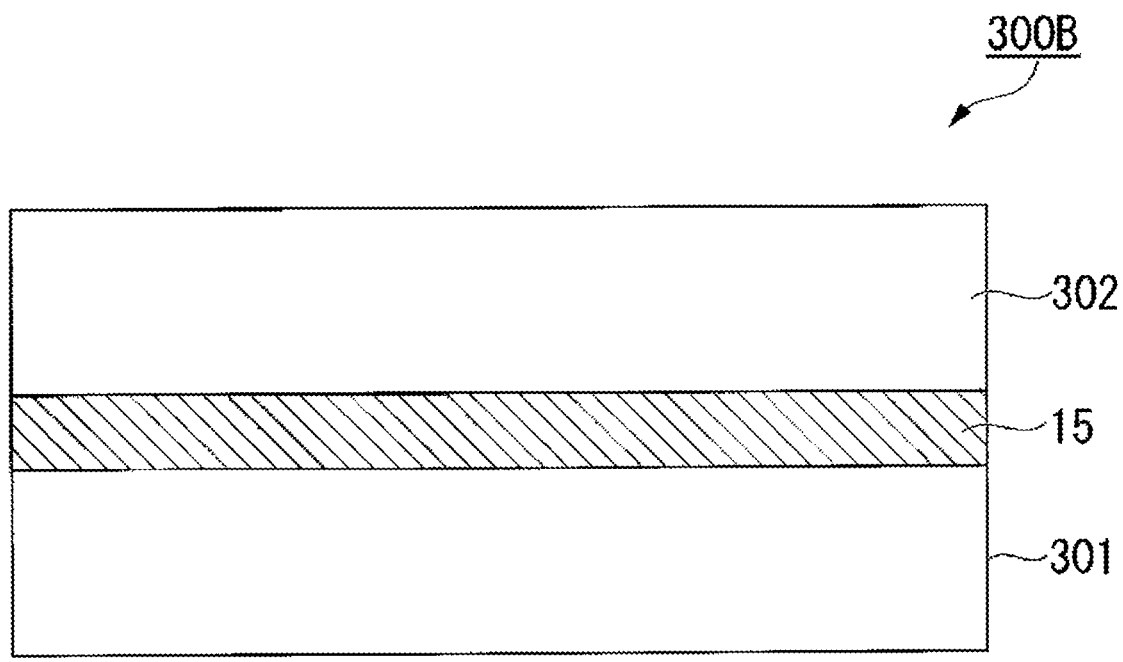
[FIG. 11]
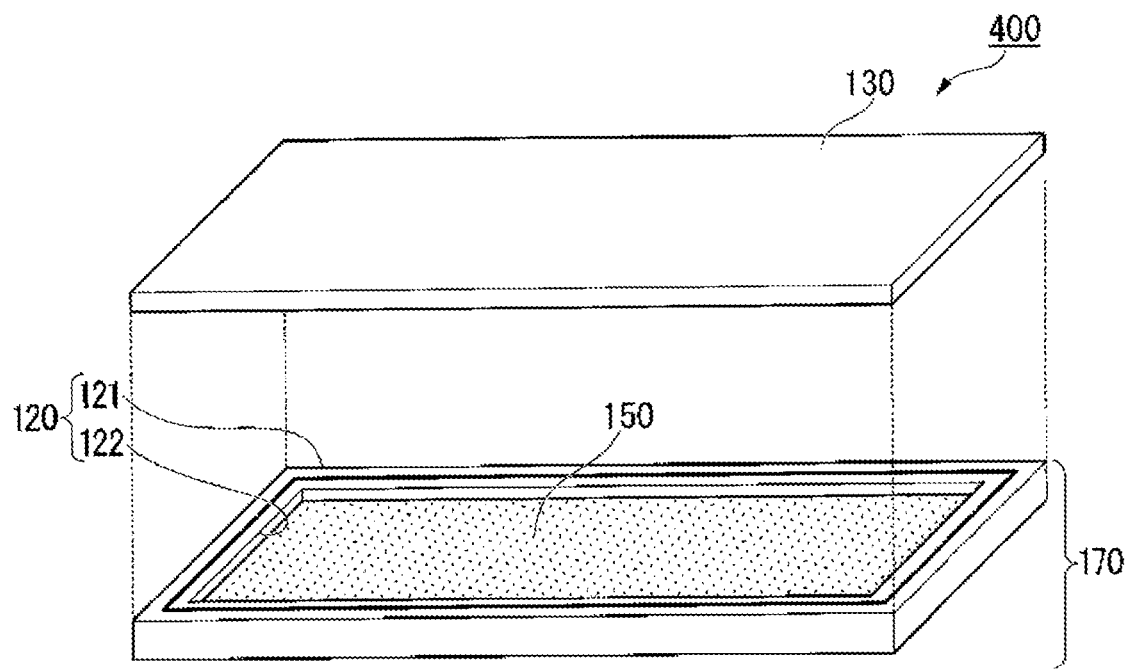

[FIG. 12]
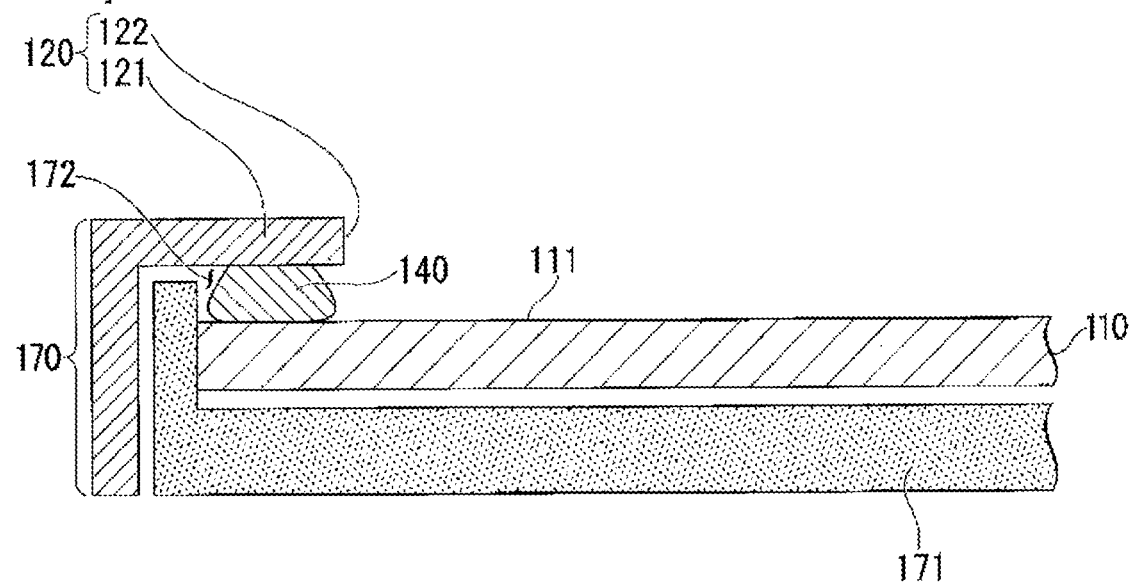
[FIG. 13]
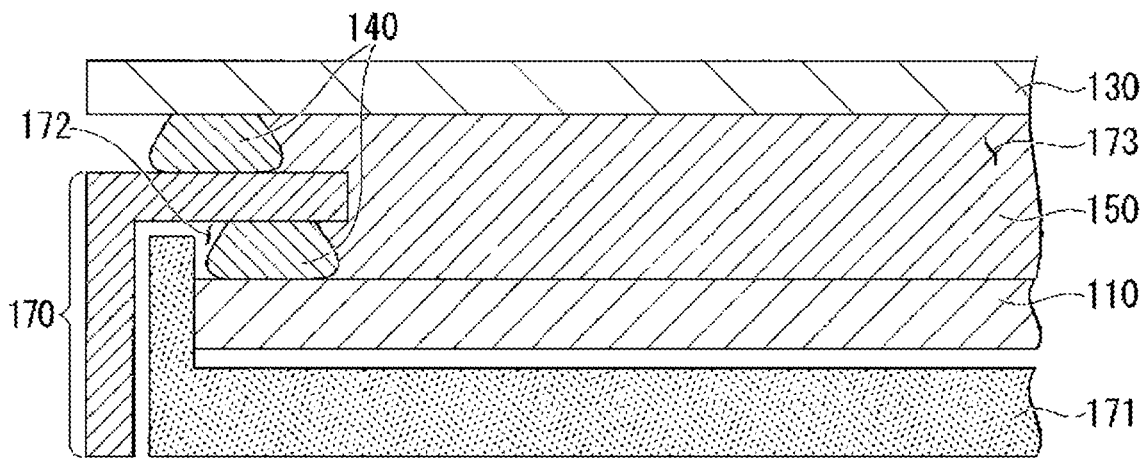
[FIG. 14]
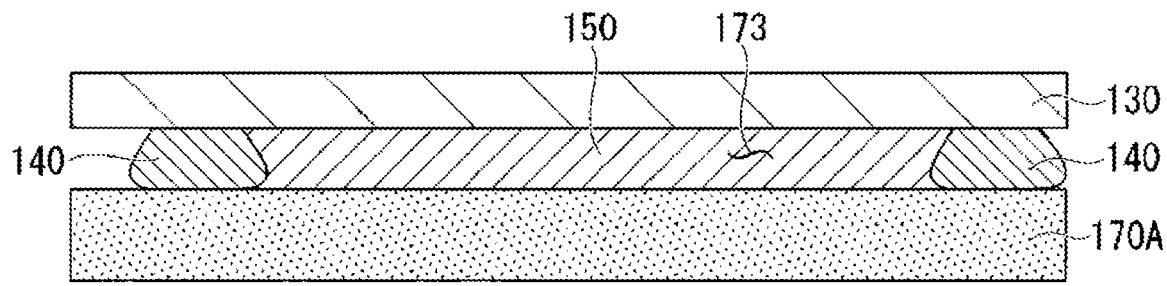

[FIG. 15]
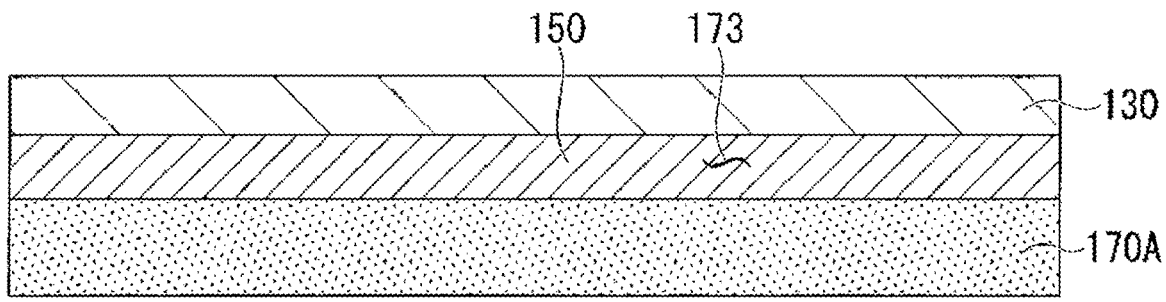

CURABLE SILICONE COMPOSITION AND CURED PRODUCT OF SAME, MULTILAYER BODY AND METHOD FOR PRODUCING SAME, AND OPTICAL DEVICE OR OPTICAL DISPLAY

CROSS-REFERENCE TO RELATED APPLICATIONS

This application is the National Stage of International Appl. No. PCT/JP2019/040432 filed on 15 Oct. 2019, which claims priority to and all advantages of Japanese Appl. No. 2018-196663 filed on 18 Oct. 2018, the content of which is hereby incorporated by reference.

TECHNICAL FIELD

The present invention is related to a curable silicone composition, cured product thereof, laminate body, manufacturing method thereof, and optical device or optical display.

BACKGROUND ART

Curable silicone compositions with high transparency and high elongation of a cured product are used as adhesives or pressure sensitive adhesives for improving the visibility of an optical display. An optical display must use a thermally unstable material such as liquid crystals, organic electroluminescence, and other display parts, touch panels, cover lenses, and other display forming members. Therefore, the used curable silicone composition is preferably cured at a relatively low temperature, specifically 40° C. or lower, and ultraviolet curable silicone compositions having been primarily applied thus far.

However, there is a demand for a low temperature curable silicone composition which does not require ultraviolet radiation because decorative portions for decoration are often provided in the display periphery and ultraviolet light is not transmitted. For example, Patent Document 1 proposes a curable silicone composition containing: an organopolysiloxane containing an alkenyl group and an aryl group; an organopolysiloxane containing a silicon-bonded hydrogen atom; a compound having a polyalkylene oxide chain; and a platinum based catalyst.

However, with conventional curable silicone compositions, the durability of an obtained cured product at low temperatures may be insufficient, and thus use may not be possible in aircraft or in cold regions. Furthermore, when a specific substitution group is introduced to improve cold resistance, the cured product becomes discolored or turbid, and thus can not be used in optical displays or touch panels.

For example, as a technology for improving the cold resistance of a composition, Patent Document 2 proposes the use of an organopolysiloxane containing 1 mol % or more a phenyl group for the purpose of improving the cold resistance of a silicone adhesive sheet. However, the document is intended for forming a sheet and does not describe or suggest a cured silicone composition for use in optical displays or the like. Furthermore, the curable silicone composition used for optical displays and the like is required to have high transparency in addition to adhesion. However, when a phenyl group is simply introduced into the curable silicone composition, compatibility is insufficient between components, which causes a decrease in transparency and turbidity. Thus, the cured product has a problem where discoloration or turbidity occurs.

RELATED ART DOCUMENTS

Patent Documents

Patent Document 1: Japanese Unexamined Patent Application 2012-111850
Patent Document 2: Japanese Unexamined Patent Application H10-012546

SUMMARY OF THE INVENTION

Problem to be Solved by the Invention

Therefore, as a curable silicone composition used in adhesives or pressure sensitive adhesives for optical displays, touch panels, and the like, there has been a demand for a composition that has excellent durability at low temperatures and a cured product with excellent transparency can be obtained.

In light of the problems of the conventional technology described above, an object of the present invention is to provide a curable silicone composition, a cured product thereof, a laminate body, a manufacturing method thereof, and an optical device or optical display exhibiting excellent performance for use as a member where transparency is required such as for an optical display, a touch panel, or the like. Specifically, an object of the present invention is to provide a curable silicone composition having excellent durability at low temperatures and a cured product having excellent transparency can be obtained.

Means for Solving the Problem

As a result of conducting diligent research on the problems described above, the present inventors arrived at the present invention. In other words, an object of the present invention is achieved by:

A curable silicone composition, containing:
(A) an organopolysiloxane having in a molecule at least 2 alkenyl groups, each with 2 to 12 carbon atoms;
(B) an organohydrogenpolysiloxane having at least 2 silicon-bonded hydrogen atoms per molecule; and
(C) a hydrosilylation reaction catalyst; where
the amount of component (B) is an amount such that the silicon-bonded hydrogen atoms in component (B) are 0.5 to 2 mol per mol of aliphatic unsaturated carbon-carbon bonds in component (A), and
2 to 17.5 mol % of the silicon-bonded organic groups in the curable silicone composition are aryl groups.

In particular, 2 to 20 mol % of the silicon-bonded organic groups in component (A) are preferably aryl groups.

Component (A) preferably contains the following components (a1) and (a2):
(a1) a straight chain or partially branched organopolysiloxane having in one molecule at least 2 alkenyl groups, each with 2 to 12 carbon atoms, where 3 to 25 mol % of silicon-bonded organic groups are aryl groups; and
(a2) an organopolysiloxane having an alkenyl group, as expressed by average unit formula: $(R^1_3SiO_{1/2})_a$ $(R^1_2SiO_{2/2})_b(R^1SiO_{3/2})_c(SiO_{4/2})_d$ (where $R^1$ independently represents a monovalent hydrocarbon group with 1 to 12 carbon atoms, at least 1 mol % of $R^1$ is an alkenyl group with 2 to 12 carbon atoms, and a, b, c and d satisfy all of the following conditions: (a+b+c+d=1, 0≤a≤0.8, 0≤b≤0.4, 0≤c≤0.8, 0≤d≤0.6, 0.2≤c+d≤0.8); and component (B) preferably contains the following components (b1) and (b2):
(b1) a straight chain organohydrogenpolysiloxane having a silicon-bonded hydrogen atom on an end of a molecular chain; and
(b2) an organohydrogenpolysiloxane having 3 or more silicon-bonded hydrogen atoms in one molecule.

In particular, the amount of component (a2) is more preferably within a range of 0.5 to 5.0 mass % relative to the sum of components forming a non-volatile solid fraction by a curing reaction of the curable silicone composition, and the amount of component (b2) is more preferably within a range of 0 to 2.0 mass % relative to the sum of components forming a non-volatile solid fraction by a curing reaction of the curable silicone composition.

The curable silicone composition of the present invention preferably further contains (D) an organic compound having two or more alkoxysilyl groups in one molecule.

In the curable silicone composition of the present invention,
i) the amount of a polyether compound is preferably 0.1 mass % or less relative to the total amount of the curable silicone composition, and
ii) the amount of a compound having an epoxy group and alkoxysilyl group is preferably 0.1 mass % or less relative to the total amount of the curable silicone composition.

(D) The content of the component (D) is preferably in a range of 0.001 to 5 mass % relative to the total amount of the curable silicone composition.

Component (C) is preferably selected from a group consisting of:
(c1) a hydrosilylation reaction catalyst that exhibits active activity without irradiating with a high energy beam;
(c2) a hydrosilylation reaction catalyst that exhibits activity by irradiating with a high energy beam; and
(c3) a hydrosilylation reaction catalyst that is a combination of component (c1) and component (c2).

Herein, high energy beams include ultraviolet rays, gamma rays, X-rays, alpha rays, electron beams, and the like, and ultraviolet rays, X-rays, and electron beams irradiated from a commercially available electron beam irradiating device are preferable. Industrially, ultraviolet rays having a wavelength within a range of 280 to 380 nm are easily used.

Component (D) preferably contains (d1), a compound having two alkoxysilyl groups at an end of a molecular chain.

The viscosity of the curable curing silicone composition at 25° C. is preferably 100,000 mPa or less.

The curable silicone composition of the present invention is preferably an optical adhesive or an optical pressure sensitive adhesive.

The present invention also relates to a cured product of the curable silicone composition of the present invention.

The cured product of the curable silicone composition of the present invention preferably has a degree of needle penetration at 25° C. within a range of 5 to 70.

Furthermore, the present invention also relates to a laminate body containing:
an adhesive layer containing the cured product of the present invention, disposed between a first transparent or non-transparent optical member and a second transparent or non-transparent optical member.

Furthermore, the present invention also relates to an optical device, containing:
a substrate;
an optical element disposed on the substrate;
the cured product of the present invention that seals at least a portion of the optical element.

Furthermore, the present invention also relates to an optical display containing the laminate body of the present invention.

The present invention also relates to a method of manufacturing a laminate body, including: an arranging step of arranging the curable silicone composition of the present invention, containing at least the hydrosilylation catalyst that exhibits activity without irradiating with a high energy beam, on one or two surfaces of at least one member of the two optical members, and then adhering the two optical members together via the curable silicone composition; and a curing step of promoting a hydrosilylation reaction of the composition by allowing to stand or heating to cure the composition.

Note that an optical member configuring the laminate body of the present invention is generally provided with a plate shaped portion having a planar expanse, and the plate shaped portion or the member itself may be curved and may have three-dimensional recesses and protrusions derived from an application of the member. Furthermore, the cured product disposed on two surfaces of the optical member and is not used for adhering with another optical member can be used as an adhesive surface for bonding to a release layer or another member.

Furthermore, the present invention also relates to a method of manufacturing a laminate body, including: an arranging step of arranging the curable silicone composition of the present invention, containing at least the hydrosilylation catalyst that exhibits activity by irradiating with a high energy beam, on one or two surfaces of at least one member of the two optical members, and then adhering the two optical members together via the curable silicone composition; and a curing step of irradiating with the high energy beam, and then allowing to stand or heating to promote a hydrosilylation reaction of the composition to cure the composition.

Furthermore, the present invention also relates to a method of manufacturing a laminate body, including: an arranging step of arranging the curable silicone composition of the present invention, containing at least the hydrosilylation catalyst that exhibits activity by irradiating with a high energy beam, on one or two surfaces of at least one member of the two optical members, performing high energy beam irradiation to form a non-fluid, semi-cured state, and then adhering the two optical members together via the curable silicone composition; and a main curing step of promoting a hydrosilylation reaction of the composition by allowing to stand or heating to main cure the composition.

Furthermore, the present invention also relates to a method of manufacturing a laminate body, including: an arranging step of arranging the curable silicone composition of the present invention, containing both the hydrosilylation catalyst that exhibits activity without irradiating with a high energy beam and the hydrosilylation catalyst that exhibits activity by irradiating with a high energy beam, on one or two surfaces of at least one member of the two optical members, causing a hydrosilylation reaction of the composition by allowing to stand or heating to form a non-fluid, semi-cured state in a low temperature region (15 to 80° C.) including room temperature (25° C.), and then adhering the two optical members together via the curable silicone composition; and a main curing step of performing high energy beam irradiation via a transparent substrate and then allowing to stand or heating to promote a hydrosilylation reaction of the composition in a semi-cured state to main cure the composition.

Furthermore, the present invention also relates to a method of manufacturing a laminate body, including: an arranging step of arranging the curable silicone composition of the present invention, containing at least the hydrosilylation catalyst that exhibits activity without irradiating with a high energy beam, on one or two surfaces of at least one member of the two optical members, causing a hydrosilylation reaction of the composition by allowing to stand or heating to form a non-fluid, semi-cured state in a low temperature region (15 to 80° C.) including room temperature (25° C.), and then adhering the two optical members together via the curable silicone composition; and a main curing step of promoting a hydrosilylation reaction of the composition in a semi-cured state by allowing to stand or heating to main cure the composition.

Furthermore, the present invention also relates to a method of manufacturing a laminate body, where the laminate body is an optical device.

Furthermore, the present invention also relates to a method of manufacturing a laminate body, where the laminate is an optical display.

Effects of the Invention

The curable silicone composition of the present invention has excellent cold resistance after curing, can be used in a low temperature environment, does not cause problems such as coloring, and can obtain a highly transparent cured product. Therefore, the composition is useful when used as an adhesive or pressure sensitive adhesive for an optical display or a touch panel.

Furthermore, the cured product and the laminate body of the present invention has excellent physical properties as an adhesive or a pressure sensitive adhesive, are optically transparent, and have excellent adhesive strength and durability. Therefore, reliability is excellent without reduced performance under any conditions.

BRIEF DESCRIPTION OF THE DRAWINGS

FIG. 1 is a cross sectional view illustrating a laminate body of an embodiment of the present invention.

FIG. 2 is a flowchart showing a method of manufacturing the laminate body of the embodiment of the present invention.

FIG. 3 is a flowchart showing a method of manufacturing a laminate body of another embodiment of the present invention.

FIG. 4 is a plan view illustrating a Micro LED according to an embodiment of the present invention.

FIG. 5 is a cross sectional view illustrating the Micro LED according to the embodiment of the present invention.

FIG. 6 is a cross sectional view illustrating a Micro LED according to another embodiment of the present invention.

FIG. 7 is a cross sectional view of a Micro LED in which a set of red (R), green (G), and blue (B) light emitting elements are arranged on a lead frame according to an embodiment of the present invention.

FIG. 8 is a cross sectional view illustrating an optical display of an embodiment of the present invention.

FIG. 9 is a cross sectional view illustrating an optical display of another embodiment of the present invention.

FIG. 10 is a cross sectional view illustrating an optical display of another embodiment of the present invention.

FIG. 11 is an exploded perspective view illustrating an optical display of another embodiment of the present invention.

FIG. 12 is a partial cross sectional view illustrating an optical display of another embodiment of the present invention.

FIG. 13 is a partial cross sectional view illustrating an optical display of another embodiment of the present invention.

FIG. 14 is a partial cross sectional view illustrating an optical display of another embodiment of the present invention.

FIG. 15 is a partial cross sectional view illustrating an optical display of another embodiment of the present invention.

DESCRIPTION OF THE PREFERRED EMBODIMENT

[Curable Silicone Composition]

The curable silicone composition of the present invention (hereinafter, also referred to as "the present composition") will be described below in detail.

Component (A) is an organopolysiloxane having in each molecule at least 2 alkenyl groups with 2 to 12 carbon atoms. Preferable examples of the alkenyl group in component (A) include vinyl groups, allyl groups, butenyl groups, pentenyl groups, hexenyl groups, heptenyl groups, octenyl groups, nonenyl groups, decenyl groups, undecenyl groups, and dodecenyl groups. Vinyl groups, allyl groups, hexenyl groups, and octenyl groups are preferable from the perspective of economic efficiency and reactivity.

Furthermore, examples of other groups that are bonded to a silicon atom in component (A) include: methyl groups, ethyl groups, propyl groups, butyl groups, pentyl groups, hexyl groups, heptyl groups, octyl groups, nonyl groups, decyl groups, undecyl groups, dodecyl groups, and other alkyl groups having 1 to 12 carbon atoms; benzyl groups, phenethyl groups, and other aralkyl groups having 7 to 12 carbon atoms; 3-chloropropyl groups, 3,3,3-trifluoropropyl groups, and other halogen-substituted alkyl groups having 1 to 12 carbon atoms; phenyl groups, tolyl groups, xylyl groups, and other aryl groups having 6 to 20 carbon atoms; and groups in which some or all hydrogen atoms of the aforementioned groups are substituted with a fluorine atom, chlorine atom, bromine atom, or other halogen atom. Methyl groups are preferable from the perspective of economic efficiency and heat resistance. Furthermore, the silicon atom in component (A) may be bonded to a small amount of hydroxyl groups or alkoxy groups such as methoxy groups, ethoxy groups, n-propoxy groups, i-propoxy groups, n-butoxy groups, sec-butoxy groups, tert-butoxy groups, and the like so long as an object of the present invention is not impaired.

While the molecular structure of component (A) is not particularly limited, examples thereof include straight chain structures, partially branched straight chain structures, branched structures, cyclic structures, and three-dimensional mesh structures. Component (A) may be a single organopolysiloxane having these molecular structures or a mixture of two or more organopolysiloxanes having these molecular structures.

Component (A) preferably contains the following component (a1) and component (a2):
(a1) a straight chain or partially branched organopolysiloxane having in a molecule at least 2 alkenyl groups, each with 2 to 12 carbon atoms and where 3 to 25 mol % of the silicon-bonded organic groups are aryl groups; and
(a2) an organopolysiloxane having an alkenyl group, as expressed by average unit formula: $(R^1_3SiO_{1/2})_a (R^1_2SiO_{2/2})_b(R^1SiO_{3/2})_c(SiO_{4/2})_d$ (where $R^1$ independently represents a monovalent hydrocarbon group with 1 to 12 carbon atoms, at least 1 mol % of $R^1$ is an alkenyl group with 2 to 12 carbon atoms, and a, b, c and d satisfy all of the following conditions: (a+b+c+d=1, 0≤a≤0.8, 0≤b≤0.4, 0≤c≤0.8, 0≤d≤0.6, 0.2≤c+d≤0.8).

Examples of component (a1) include dimethylpolysiloxane-methylphenylsiloxane copolymers blocked at both ends of a molecular chain with dimethyvinylsiloxy groups, dimethylpolysiloxane-diphenylsiloxane copolymers blocked at both ends of a molecular chain with dimethyvinylsiloxy groups, dimethylpolysiloxane-diphenylsiloxane copolymers blocked at both ends of a molecular chain with dimethyvinylsiloxy groups, and dimethylpolysiloxane-methylnaphthyl siloxane copolymers blocked at both ends of a molecular chain with dimethyvinylsiloxy groups. Examples thereof include dimethylpolysiloxane-methylphenylsiloxane copolymers blocked at both ends of a molecular chain with methylphenylvinylsiloxy groups and mixtures of two or more of these organopolysiloxanes.

In the formula of component (a2), $R^1$ independently represents a monovalent hydrocarbon group having 1 to 12 carbon atoms, and examples include alkyl groups, alkenyl groups, aryl groups, aralkyl groups, and groups in which some or all of the hydrogen atoms of the aforementioned groups are substituted with a fluorine atom, a chlorine atom, a bromine atom, or other halogen atom. However, at least 1 mol % of $R^1$ is an alkenyl group having 2 to 12 carbon atoms.

Examples of component (a2) include tetrakis(dimethylvinylsiloxy)silane, hexa(dimethylvinylsiloxy)disiloxane, and organopolysiloxane resins as expressed by the following average unit formulae:

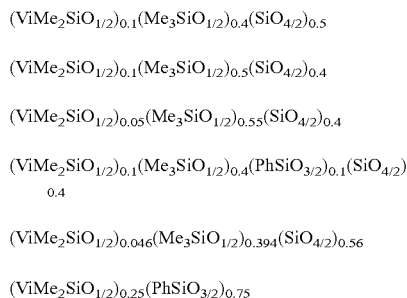

Note that in the aforementioned formulae, Me represents a methyl group, Ph represents a phenyl group, and Vi represents a vinyl group.

The amount of component (a2) is within a range of 0.5 to 10.0 mass %, and preferably within a range of 1.0 to 5.0 mass % relative to the solid fraction of the curable silicone composition. Herein, solid fraction refers to the sum of components forming a non-volatile solid fraction by a curing reaction, and particularly includes components (A) to (D) and non-volatile optional components configuring the present composition.

In the curable silicone composition of the present invention, 2 to 17.5 mol %, and preferably 3.5 to 15 mole % of the silicon-bonded organic groups in component (A) are aryl groups. When the ratio of the aryl groups is within the aforementioned range, the curable silicone composition can have excellent cold resistance.

Examples of the aryl groups in component (A) include phenyl groups, tolyl groups, naphthyl groups, and xylyl groups, but from the perspective of economic efficiency, phenyl groups are preferred.

Furthermore, while the viscosity of component (A) at 25° C. is not limited, the viscosity is preferably within a range of 50 to 100,000, within a range of 100 to 100,000 mPa·s, within a range of 100 to 50,000 mPa·s, or within a range of 100 to 10,000 mPa·s. This is because, if the viscosity of component (A) is above the lower limit of the aforementioned range, the mechanical properties of the cured product obtained will be enhanced; in contrast, if the viscosity is below the upper limit of the aforementioned range, the handleability of the composition obtained will be enhanced.

Component (B) is an organopolysiloxane having at least two silicon-bonded hydrogen atoms per molecule. Examples of groups that are bonded to a silicon atom other than silicon-bonded hydrogen atoms in component (B) include: alkyl groups with 1 to 12 carbon atoms such as methyl groups, ethyl groups, propyl groups, butyl groups, pentyl groups, hexyl groups, heptyl groups, octyl groups, nonyl groups, decyl groups, undecyl groups, dodecyl groups, and the like; aryl groups with 6 to 20 carbon atoms such as phenyl groups, tolyl groups, xylyl groups, and the like; aralkyl groups with 7 to 20 carbon atoms such as benzyl groups, phenethyl groups, and the like; and halogen substituted alkyl groups with 1 to 12 carbon atoms such as 3-chloropropyl groups, 3,3,3-trifluoropropyl groups, and the like. Methyl groups and phenyl groups are preferable from the perspective of economic efficiency and heat resistance. Furthermore, the silicon atom in component (B) may be bonded to a small amount of hydroxyl groups or alkoxy groups such as methoxy groups, ethoxy groups, n-propoxy groups, i-propoxy groups, n-butoxy groups, sec-butoxy groups, tert-butoxy groups, and the like so long as an object of the present invention is not impaired.

While the molecular structure of component (B) is not particularly limited, examples thereof include straight chain structures, partially branched straight chain structures, branched structures, cyclic structures, and three-dimensional mesh structures. Component (B) may be a single organopolysiloxane having these molecular structures or a mixture of two or more organopolysiloxanes having these molecular structures.

Preferably, the component (b) contains the following components (b1) and (b2):
(b1) a straight chain organohydrogenpolysiloxane having a silicon-bonded hydrogen atom on an end of a molecular chain; and
(b2) an organohydrogenpolysiloxane having 3 or more silicon-bonded hydrogen atoms in one molecule.

Component (b1) is a straight chain organohydrogenpolysiloxane having a silicon-bonded hydrogen atom at an end of a molecular chain, which is a component that functions as a chain length extender in a hydrosilylation reaction with component (A) and improves the flexibility of the cured reaction product. Component (b1) preferably contains an aryl group or has a low molecular weight in order to achieved favorable compatibility with component (A) containing the aryl group.

Examples of such component (b1) include 1,1,3,3-tetramethyldisiloxane, 1,1,3,3,5,5-hexamethyltrisiloxane, dimethylpolysiloxanes blocked at both ends of a molecular chain with dimethylhydrogensiloxy groups, dimethylsiloxane-methylphenylsiloxane copolymers blocked at both ends of a molecular chain with dimethylhydrogensiloxy groups, dimethylpolysiloxanes blocked at both ends of a molecular chain with dimethylhydrogensiloxy groups, didimethylsiloxane-diphenylsiloxane copolymers blocked at both ends of a molecular chain with dimethylhydrogensiloxy groups, and mixture of two or more types of these organopolysiloxanes.

Component (b2) is an organohydrogenpolysiloxane having three or more silicon-bonded hydrogen atoms in one molecule, which functions as a crosslinking agent in a hydrosilylation reaction with component (A) and adjusts the hardness of the cured product based on the added amount thereof. Component (b2) preferably contains an aryl group or has a low molecular weight in order to achieved favorable compatibility with component (A) containing the aryl group.

Examples of such component (b2) include methyl tris(dimethylsiloxy)silane, tetrakis(dimethylsiloxysilane), methylhydrogenpolysiloxane blocked at both ends of a molecular chain with trimethylsiloxy groups, methylhydrogensiloxane-dimethylsiloxane copolymers blocked at both ends of a molecular chain with trimethylsiloxy groups, methylhydrogensiloxane-methylphenylsiloxane copolymers blocked at both ends of a molecular chain with trimethylsiloxy groups, and organopolysiloxane resins as expressed by the following average unit formulae:

$(HMe_2S_{1/2})_{0.6}(SiO_{4/2})_{0.4}$ $(HMe_2SiO_{1/2})_{0.3}(Me_3SiO_{1/2})_{0.3}(SiO_{4/2})_{0.4}$ $(HMe_2SiO_{1/2})_{0.5}(Me_3SiO_{1/2})_{0.05}(SiO_{4/2})_{0.4}$ $HMe_2SiO_{1/2})_{0.5}(PhSiO_{3/2})_{0.1}(SiO_{4/2})_{0.4}$ $(HMe_2SiO_{1/2})_{0.6}(PhSiO_{3/2})_{0.4}$ $(HMe_2SiO_{1/2})_{0.75}(PhSiO_{3/2})_{0.25}$ and mixtures of two or more types of these organopolysiloxanes. Note that in the aforementioned formulae, Me represents a methyl group and Ph represents a phenyl group.

The component (b2) is an optional component, and the amount thereof is within a range of 0 to 2.0 mass %, may be within a range of 0.001 to 2.0 mass %, and preferably 0.01 to 1.0 mass % relative to the solid fraction of the curable silicone composition. Herein, solid fraction refers to the sum of components forming a non-volatile solid fraction by a curing reaction, and particularly includes components (A) to (D) and non-volatile optional components configuring the present composition.

Although the viscosity of component (B) at 25° C. is not limited, the viscosity is preferably 10,000 mPa·s or less, within a range of 1 to 1,000 mPa·s, or within a range of 1 to 500 mPa·s. This is because if the viscosity of component (B) is above the lower limit of the aforementioned range, the mechanical properties of an obtained cured product are enhanced. However, on the other hand, if the viscosity is below the upper limit of the aforementioned range, the transparency and handleability of an obtained composition are enhanced.

The amount of the component (B) is an amount within a range of 0.5 to 2 mols of silicon-bonded hydrogen atoms in the present component, preferably an amount of at least 0.6 mols, at least 0.7 mols, or at least 0.8 mols, an amount of at most 1.7 mols, at most 1.5 mols, or at most 1.3 mols, and an amount that is within an arbitrary range of these upper and lower limits, relative to 1 mol of aliphatic unsaturated carbon-carbon bonds in component (A). This is because if the amount of component (B) is above the lower limit of the aforementioned range, an obtained composition will be sufficiently cured. However, on the other hand, if the amount is below the upper limit of the aforementioned range, the mechanical properties of an obtained cured product will be enhanced.

Component (C) is a hydrosilylation reaction catalyst for promoting the curing of the present composition. Examples thereof include platinum based catalysts, rhodium based catalysts, palladium based catalysts, nickel based catalysts, iridium based catalysts, ruthenium based catalyst, and iron based catalysts, and platinum based catalysts are preferable.

The amount of component (C) is an amount that promotes the curing of the present composition and is specifically an amount in which the platinum atoms in the catalyst are within a range of from 0.1 to 1000 μm in mass units with respect to the present composition. This is because when the amount of component (C) is greater than or equal to the lower limit of the range described above, the curing of the resulting composition progresses, while when the amount is less than or equal to the upper limit of the range described above, the resulting cured product becomes less susceptible to discoloration.

Examples of such component (C) that can be preferably used include components selected from a group consisting of:
 (c1) a hydrosilylation reaction catalyst that exhibits active activity without irradiating high energy beams;
 (c2) a hydrosilylation reaction catalyst that exhibits activity by irradiating high energy beams; and
 (c3) a hydrosilylation reaction catalyst, which is a combination of components (c1) and (c2).

Component (c1) is a hydrosilylation reaction catalyst that exhibits active activity without irradiating high energy beams. Component (c1) is preferably a platinum based catalyst. Examples of the platinum based catalyst include platinum based compounds, such as platinum fine powders, platinum black, platinum-supported silica fine powders, platinum-supported activated carbon, chloroplatinic acids, alcohol solutions of chloroplatinic acids, olefin complexes of platinum, alkenylsiloxane complexes of platinum, and the like. Alkenylsiloxane complexes of platinum are particularly preferable. Exemplary alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. The platinum-alkenyl siloxane complex has favorable stability, and therefore 1,3-divinyl-1,1,3,3-tetramethyldisiloxane is particularly preferable. Furthermore, the stability of the platinum-alkenylsiloxane complex can be improved. Therefore, 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, and 1,3,5,7-tetramethyl-1,3,5,7-tetravinylcyclotetrasiloxane, or other alkenylsiloxane or dimethylsiloxane oligomers or other organosiloxane oligomers are preferably added to the complex, and an alkenylsiloxane is particularly preferably added to the complex.

The catalyst of component (c1) is a catalyst that is active without irradiating with a high energy beam, and a catalyst that is active even at a relatively low temperature is more preferable. Specifically, activity is exhibited in the composition in a temperature range of 0 to 200° C., preferably a temperature range of 0 to 150° C., more preferably a temperature range of 0 to 150° C., even more preferably a temperature range of 20 to 150° C. to promote a hydrosilylation reaction. The amount of component (c1) varies depending on the type of catalyst and the type of composition, but is usually an amount in which the metal atoms in the catalyst are within a range of 0.01 to 50 ppm based on mass units relative to the composition, and is preferably within a range of 0.1 to 30 ppm. If the amount of the component is too low, the curing speed will be too slow, and if the amount added is too high, the usable time will be too short, which causes practical inconvenience and is also uneconomical. Note that the hydrosilylation reaction sufficiently progresses even if the composition is left at room temperature without a hydrosilylation reaction retardant described later. Therefore, the present composition may be left at room temperature (25° C.) or may be heated higher than room temperature within the aforementioned temperature range, in order to form a semi-cured state or a fully main cured state for the composition of the present invention. More specifically, the curable silicone composition of the present invention may form a semi-cured state or a fully main cured state at a relatively low temperature range of 15 to 80° C. Note that in the present invention, the "semi-cured state" indicates a state where, as a result of the curing reaction progressing, the composition loses fluidity and forms a cured reactant in a low temperature region (15 to 80° C.) including room temperature (25° C.), but the cured reactant still maintains curing reactivity, and the curing reaction further progresses by setting a curing condition such as continued irradiation of a high energy beam, heating, or the like. The cured reactant in the semi-cured state is referred to as a "semi-cured product". Furthermore, as a result of the curing reaction progressing, the curing reaction of the composition stops, curing reactivity is lost, and a state is reached in which the curing reaction does not progress any further, which is referred to as the "main cured state".

Component (c2) is a hydrosilylation reaction catalyst that does not exhibit activity without irradiating with a high energy beam, but exhibits activity by irradiating a high energy beam. Component (c2) is a so-called high energy beam activated catalyst or photoactivated catalyst, which is known in the present technical field.

Examples of high energy beams include ultraviolet rays, gamma rays, X-rays, alpha rays, electron beams, and the like. In particular, examples include ultraviolet rays, X-rays, and electron beams irradiated from a commercially available electron beam irradiating device. Of these, ultraviolet rays are preferable from the perspective of efficiency of catalyst activation, and ultraviolet rays within a wavelength range of 280 to 380 nm are preferable from the perspective of industrial use. Furthermore, the amount of irradiation varies depending on the type of high energy beam activated catalyst, but in the case of ultraviolet rays, the integrated amount of irradiation at a wavelength of 365 nm is preferably within a range of 100 mJ/cm$^2$ to 10 J/cm$^2$.

Specific examples of component (c2) include (methylcyclopentadienyl) trimethyl platinum (IV), (cyclopentadienyl) trimethyl platinum (IV), (1,2,3,4,5-pentamethyl cyclopentadienyl) trimethyl platinum (IV), (cyclopentadienyl) dimethylethyl platinum (IV), (cyclopentadienyl) dimethylacetyl platinum (IV), (trimethylsilyl cyclopentadienyl) trimethyl platinum (IV), (methoxycarbonyl cyclopentadienyl) trimethyl platinum (IV), (dimethylsilyl cyclopentadienyl) trimethylcyclopentadienyl platinum (IV), trimethyl (acetylacetonato) platinum (IV), trimethyl (3,5-heptanedionate) platinum (IV), trimethyl (methylacetoacetate) platinum (IV), bis(2,4-pentanedionato) platinum (II), bis(2,4-hexanedionato) platinum (II), bis(2,4-heptanedionato) platinum (II), bis(3,5-heptanedionato) platinum (II), bis(1-phenyl-1,3-butanedionato) platinum (II), bis(1,3-diphenyl-1,3-propanedionato) platinum (II), and bis(hexafluoroacetylacetonato) platinum (II). Of these, (methylcyclopentadienyl) trimethyl platinum (IV) and bis(2,4-pentanedionato) platinum (II) are preferred from the perspective of versatility and ease of acquisition.

The amount of component (c2) is the amount needed to further cure the composition semi-cured by component (c1) and is preferably an amount in which metal atoms in the catalyst are within a range of 1 to 50 ppm by mass units, and preferably within a range of 5 to 30 ppm, with regard to the present composition.

The molar ratio ((c1)/(c2)) of components (c1) and (c2) is usually 0.001 to 1000, and preferably 0.01 to 100. This is because the curing reaction by irradiating with a high energy beam can be accelerated when the molar ratio is below the above mentioned upper limit, and the curing reaction can be performed at a low temperature in a short period of time when the molar ratio is above the above mentioned lower limit.

The component (D) is a compound having two or more alkoxysilyl groups per molecule, and functions as an adhesion promoter to improve the adhesive strength of the present composition, and is a component for exhibiting a unique adhesive behavior in which the adhesive strength significantly increases after a certain period of time. Examples of the alkoxysilyl group include trimethoxysilyl groups, methyldimethoxysilyl groups, triethoxysilyl groups, methyldiethoxysilyl groups, and triisopropoxysilyl groups.

Component (D) preferably contains (d1) an organic compound having two or three alkoxysilyl groups at an end of a molecular chain. Furthermore, the organic compound herein include organic silicon compounds in addition to alkane compounds and the like. Specific examples of component (d1) include 1,2-bis(trimethoxysilyl) ethane, 1,2-bis(triethoxysilyl) ethane, 1,2-bis(methyldimethoxysilyl) ethane, 1,2-bis(methyldiethoxysilyl) ethane, 1,3-bis(trimethoxysilyl) propane, 1,4-bis(trimethoxysilyl) butane, 1,4-bis(triethoxysilyl) butane, 1-methyldimethoxysilyl-4-trimethoxysilylbutane, 1-methyldiethoxysilyl-4-triethoxysilylbutane, 1,4-bis(methyldimethoxysilyl) butane, 1,4-bis(methyldiethoxysilyl) butane, 1,5-bis(trimethoxysilyl) pentane, 1,5-bis(triethoxysilyl) pentane, 1,4-bis(trimethoxysilyl) pentane, 1,4-bis(triethoxysilyl) pentane, 1-methyldimethoxysilyl-5-trimethoxysilylpentane, 1-methyldiethoxysilyl-5-triethoxysilylpentane, 1,5-bis(methyldimethoxysilyl) pentane, 1,5-bis(methyldiethoxysilyl) pentane, 1,6-bis(trimethoxysilyl) hexane, 1,6-bis(triethoxysilyl) hexane, 1,4-bis(trimethoxysilyl) hexane, 1,5-bis(trimethoxysilyl) hexane, 2,5-bis(trimethoxysilyl) hexane, 1-methyldimethoxysilyl-6-trimethoxysilylhexane, 1-phenyldiethoxysilyl-6-triethoxysilylhexane, 1,6-bis(methyldimethoxysilyl) hexane, 1,7-bis(trimethoxysilyl) heptane, 2,5-bis(trimethoxysilyl) heptane, 2,6-bis(trimethoxysilyl) heptane, 1,8-bis(trimethoxysilyl) octane, 1,8-bis(methyldimethoxysilyl) octane, 2,5-bis(trimethoxysilyl) octane, 2,7-bis(trimethoxysilyl) octane, 1,9-bis(trimethoxysilyl) nonane, 2,7-bis(trimethoxysilyl) nonane, 1,10-bis(trimethoxysilyl) decane, 3,8-bis(trimethoxysilyl) decane, and other alkane compounds having two alkoxysilyl groups, 1,3-bis{2-(trimethoxysilyl) ethyl}-1,1,3,3-tetramethyldisiloxane, 1,3-bis{2-(methyldimethoxysilyl) ethyl}-1,1,3,3-tetramethyldisiloxane, 1,3-bis{2-(triethoxysilyl) ethyl}-1,1, 3,3-tetramethyldisiloxane, 1,3-bis{2-(methyldiethoxysilyl) ethyl}-1,1,3,3-tetramethyldisiloxane, 1,3-bis{6-(trimethoxysilyl) hexyl}-1,1,3,3-tetramethyldisiloxane, 1,3-bis{6-(triethoxysilyl) hexyl}-1,1,3,3-tetramethyldisiloxane, and other disiloxane compounds having two alkoxysilyl groups. Furthermore, examples of organic compounds having three alkoxysilyl groups include 1,3,5-tris{2-(trimethoxysilyl) ethyl}-1,1,3,5,5-pentamethyl trisiloxane, 1,3,5-tris{2-(methyldimethoxysilyl) ethyl}-1,1,3,5,5-tetramethyldisiloxane, 1,3,5-tris{2-(triethoxysilyl) ethyl}-1,1,3,5,5-tetramethyldisiloxane, 1,3,5-tris{2-(methyldiethoxysilyl) ethyl}-1,1,3,5,5-tetramethyl disiloxane, 1,3,5-tris{6-(trimethoxysilyl) hexyl}-1,1,3,5,5-tetramethyl disiloxane, and other trisiloxane compounds having three alkoxysilyl groups. An example of the structure is:

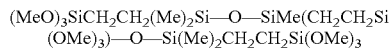

(where Me represents a methyl group).

While not limited thereto, the amount of component (D) is preferably within a range of 0.01 to 5 mass parts, or within a range of 0.01 to 3 mass parts, relative to 100 mass parts of the total of components (A) to (C) because curing properties and discoloration of the cured product are not promoted.

In the curable silicone composition of the present invention, the amount of polyether compounds is 0.1 mass % or less relative to the total amount of the curable silicone composition. This is because a cured product having high transparency can be obtained when the amount of the polyether compound is 0.1 mass % or less.

Examples of the polyether compound include polyether compounds with a hydroxyl group, an alkoxy group, or an acyloxy group at an end, and examples of a polyether structure of a main chain include polyoxyethylenes, polyoxypropylenes, and polyoxybutylenes.

More specifically, the polyether may be a polyoxyalkylene compound as expressed by general formula:

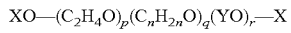

In the aforementioned formula, X represents the same or different hydrogen atom, alkyl group having 1 to 12 carbon atoms, alkenyl group having 2 to 12 carbon atoms, aryl group having 6 to 20 carbon atoms, acyl group having 1 to 12 carbon atoms, acryl group, or methacryl group. Exemplary alkyl groups of X include methyl groups, ethyl groups, propyl groups, butyl groups, pentyl groups, hexyl groups, heptyl groups, octyl groups, nonyl groups, decyl groups, undecyl groups, and dodecyl groups. Exemplary alkenyl groups of X include vinyl groups, allyl groups, 2-methyl-2-propene-1-yl groups (so-called methallyl groups), 3-buten-1-yl groups, 3-methyl-3-butene-1-yl groups, 4-butene-1-yl groups, 5-pentene-1-yl groups, 4-vinylphenyl groups, and 4-(1-methylvinyl)phenyl groups. Exemplary aryl groups of X include phenyl groups, o-methylphenyl groups, p-methylphenyl groups, o-phenylphenyl groups (so-called o-biphenyl groups), p-phenylphenyl groups (so-called p-biphenyl groups), and p-nonylphenyl groups.

Furthermore, in the aforementioned formula, Y represents a divalent hydrocarbon group having 2 to 20 carbon atoms, and specific examples thereof include ethylene groups, propylene groups, butylene groups, pentylene groups, neopentylene groups, hexylene groups, 1,4-phenylene groups, 2-methyl-1,4-phenylene groups, 2-phenyl-1,4-phenylene groups, and 4,4'-(propane-2,2-diyl)diphenyl groups.

Furthermore, in the formula, n represents an integer of 3 to 6.

Furthermore, in the above formula, p is an integer satisfying $2 \leq p \leq 100$, preferably an integer satisfying $2 \leq p \leq 75$ or $2 \leq p \leq 50$. In contrast, q is an integer satisfying $0 \leq q \leq 50$, preferably an integer satisfying $0 \leq q \leq 30$ or $2 \leq q \leq 30$.

Furthermore, in the formula, r represents an integer of 0 or 1.

The polyoxyalkylene compound is a polyoxyalkylene compound containing one type or a mixture of two or more types expressed by the aforementioned general formula. In the general formula of the polyoxyalkylene compound, units expressed by the formula: $C_2H_4O$, units expressed by the formula: $C_nH_{2n}O$, and units represented by the formula: YO may each be randomly connected or may each be connected in a block shape.

Examples of the polyoxyalkylene compound include the following compounds. Note that in the formula, Me represents a methyl group, $X^1$, $X^2$, $X^3$, $X^4$, and $X^5$ represent a methyl group, allyl group, methallyl group, acryl group, and hydrogen atom, respectively, p represents an integer between 2 and 100, and q represents an integer between 1 and 50. Note that any unit may be randomly connected or may be connected by a block.

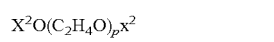

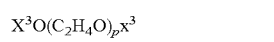

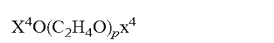

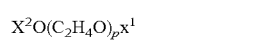

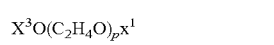

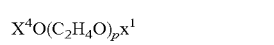

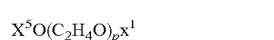

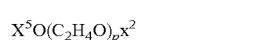

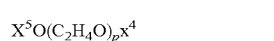

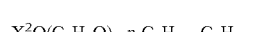

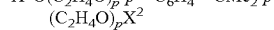

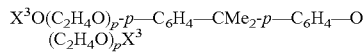

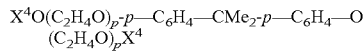

In the curable silicone composition of the present invention, the amount of a compound having an epoxy group and alkoxysilyl group is 0.1 mass % or less relative to the total amount of the curable silicone composition. This is because a cured product having high transparency can be obtained when the amount of the compound having an epoxy group and an alkoxysilyl group is 0.1 mass % or less. This is because the polyether compounds are inherently water-absorbent, which causes moisture-derived turbidity in the composition over time, impairing permanent transparency.

Examples of compounds having an epoxy group and an alkoxysilyl group include 3-glycidoxypropyl trimethoxysilane, 3-glycidoxypropyl methyldimethoxysilane, 3-glycidoxypropyl triethoxysilane, 3-glycidoxypropyl methyldiethoxysilane, 2-(3,4-epoxycyclohexyl) ethyl trimethoxysilane, 2-(3,4-epoxycyclohexyl) ethyl methyldimethoxysilane, and 2-(3,4-epoxycyclohexyl) ethyl triethoxysilane.

Moreover, the present composition may contain a hydrosilylation reaction retarder in order to control the time to cure. Examples of the hydrosilylation reaction retarders include: alkyne alcohols such as 1-ethynyl cyclohexane-1-ol, 2-methyl-3-butyne-2-ol, 3,5-dimethyl-1-hexyne-3-ol, 2-phenyl-3-butyne-2-ol, and the like; enyne compounds such as 3-methyl-3-pentene-1-yne, 3,5-dimethyl-3-hexene-1-yne, and the like; methyl alkenyl siloxane oligomers such as 1,3,5,7-tetramethyl-1,3,5,7-tetravinyl cyclotetrasiloxane, 1,3,5,7-tetramethyl-1,3,5,7-tetrahexenyl cyclotetrasiloxane, and the like; alkynoxysilanes such as dimethyl bis(3-methyl-1-butyne-3-oxy)silane, methylvinyl bis(3-methyl-1-butyne-3-oxy)silane, and the like; alkyneoxysilane compounds such as methyltris(1-methyl-1-phenyl-propyneoxy)silane, dimethylbis(1-methyl-1-phenyl-propyneoxy)silane, methyltris (1,1-dimethyl-propyneoxy)silane, dimethylbis(1,1-dimethyl-propyneoxy)silane, and the like; and benzotriazoles.

Because the amount of the hydrosilylation reaction retarder is not limited and provides sufficient pot life to the present composition, the amount is preferably within a range of 0.0001 to 5 mass parts, within a range of 0.01 to 5 mass parts, or within a range of 0.01 to 3 mass parts, relative to 100 mass parts of the total of components (A) to (D). However, when the present composition is left to stand at room temperature without heating/irradiating a high energy beam to cure or semi-cure, the composition does not need to contain a hydrosilylation reaction retardant and is preferred from the perspective of a curing reaction.

Furthermore, so long as an object of the present invention is not impaired, if necessary, the present composition may contain conventionally known additives including: metal oxide fine powder such as fumed silica, wet silica, and the like; an alkenyl group-containing low molecular weight siloxane as a reactive diluent such as 1,1,3,3-tetramethyl-1,3-divinyldisiloxane, 1,3,5,7-tetramethyl-1,3,5,7-tetravinyl-cyclotetrasiloxane, and the like; and a hindered phenol compound acting as conservation stability improvers such as 2,6-ditert-butyl-4-methylphenol, 2,6-ditert-butyl-4-hydroxymethylphenol, 2,6-bis(hydroxymethyl)-p-cresol, and the like, along with a heat-resistant improver such as N-nitrosophenylhydroxylamine aluminum salt and the like.

The present composition may suitably contain a non-reactive organopolysiloxane as a plasticizer or viscosity modifier of the cured product. Specific examples include straight chain or branched organopolysiloxanes and organopolysiloxane resins, which do not contain a functional group such as alkenyl groups and the like. In particular, when the component is used, the hardness (degree of needle penetration) and fluidity (viscosity) in the cured or semi-cured state can be adjusted to a desired range.

Although the viscosity of the present invention at 25° C. is not limited, the viscosity is preferably 100,000 mPa·s or less, within a range of 200 to 100,000 mPa·s, or within a range of 500 to 30,000 mPa·s. This is because, if the viscosity of the present composition is above the lower limit of the aforementioned range, the mechanical properties of the cured product obtained will be good; however, if, on the other hand, the viscosity is below the upper limit of the aforementioned range, the handleability of the composition obtained will be enhanced and air is less likely to be entrained in the cured product. Note that these viscosities can be measured by a rotational viscometer.

The present composition can be prepared by uniformly mixing components (A) to (D), and if necessary, any other components. When preparing the present composition, mixing can be performed at room temperature using various types of stirrers or kneaders, and if necessary, mixing can be performed while heating. Furthermore, the order of combining the various components is not restricted, and mixing can be performed in any order.

Moreover, the present composition can be a one part composition in which all of the components are blended in the same container, or can be a two part composition which mixes during use in view of storage stability.

The present composition can be cured in a relatively low temperature range (for example, 15 to 80° C. range) including room temperature. Note that the curing reaction of the present composition can be adjusted to a desired speed based on the concentration of a catalyst metal in component (C) and the type or amount of the aforementioned hydrosilylation reaction retarder.

The present composition is useful as various potting agents, sealants, and adhesives/pressure sensitive adhesives, is preferably useful as an optical pressure sensitive adhesive/adhesive, and is particularly useful as an optical pressure sensitive adhesive/adhesive for a display. At high temperatures or high temperatures and high humidity, the cured product thereof has little discoloration and tends not to cause turbidity making it suitable as a material that forms an intermediate layer between an image displaying part and a protecting part of a display.

The present composition can be used not only for liquid crystal displays but also for the display field in general, such as organic EL displays, electronic paper displays, plasma displays, and the like. A method of using the present composition in the field will be discussed later.

The present composition cures at a relatively low temperature, and therefore can be suitably applied in coating a substrate with inferior heat resistance. The type of substrate is generally a transparent substrate such as glass, along with synthetic resin films, sheets, and transparent electrode coatings. Furthermore, examples of a method of applying the present composition include dispensing, gravure coating, microgravure coating, slit coating, slot die coating, screen printing, stencil printing, and comma coating.

[Cured Product]

Next, the cured product of the present invention will be described in detail.

The cured product of the present invention (hereinafter, referred to as "the present cured product") is obtained by curing the curable silicone composition described above.

While the shape of the cured product is not limited, examples thereof include sheets, films, tapes, and lumps. Furthermore, integrating with various types of substrates is also possible.

The present composition is preferably cured to form an elastomeric (elastic) resin member or a gel-like resin member, and the degree of needle penetration at 25° C. as stipulated in JIS K2220 (hereinafter, simply referred to as the "degree of needle penetration") for the silicone resin member after curing is preferably within a range of 5 to 70 at 25° C. The degree of needle penetration is more preferably within a range of 10 to 60, or 20 to 50. The silicone resin member has moderate flexibility and durability, and has excellent adhesion/adhesion retention and followability between members, and thus can be used as a gap sealant composition for a displaying device to achieve a reliable sealing effect.

For example, as a method of forming the present cured product, after coating the present composition on a film like substrate, a tape like substrate, or a sheet like substrate, a hydrosilylation reaction can be induced by irradiating with a high energy beam, leaving to stand at room temperature, or heating at a low temperature to promote curing. Furthermore, there are cases in which the present composition is arranged between two substrates and then cured with both substrates firmly bonded. There are also cases in which the present composition is smoothly applied to at least one surface of the substrate, semi-cured, and then non-fluidized. Thereafter, both substrates are adhered together, and the present composition is further cured so as to firmly adhere both substrates. While not limited thereto, the film thickness of this cured product is preferably 1 to 100,000 µm, more preferably 50 to 30,000 µm.

A laminate body, optical device, and optical display of an embodiment of the present invention will be described below. Note that in the following description and drawings, the same reference code is assigned to the same or equivalent elements, and duplicate descriptions are omitted.

A laminate body, optical device, and optical display of an embodiment of the present invention will be described below. Note that in the following description and drawings, the same reference code is assigned to the same or equivalent elements, and duplicate descriptions are omitted.

[Laminate Body]

FIG. 1 is a cross sectional view illustrating a laminate body of an embodiment of the present invention. A laminate body 1 of an embodiment of the present invention has a first optical member 20, a second optical member 21, and an adhesive layer 15 containing the present cured product disposed between the two optical members 20 and 21. In the laminate body 1, the two optical members 20, 21 are adhered by the adhesive layer 15. The optical members may be transparent or non-transparent, and one or both optical members may be a single substrate or an optical member that is itself an independent laminate body, such as a backlight unit. Note that an optical member configuring the laminate body of the present invention is generally provided with a plate shaped portion having a planar expanse, and the plate shaped portion or the member itself may be curved and may have three-dimensional recesses and protrusions derived from an application of the member.

The first optical member 20 is a first substrate, and the second optical member 21 is a second substrate. The two optical members 20 and 21 can optionally be combined. The two optical members 20 and 21 may be identical or mutually different.

The optical members 20 and 21 are generally used as components of an optical display. More specifically, the optical members 20 and 21 can be, for example, a lens (which may be made of resin or glass), an optical sheet like member (including a color filter, a polarizer, a retardation plate, a viewing angle expanding film, a brightness enhancing film, a reflection sheet, and a transparent conductive film), an optical protecting material which may be transparent (a transparent protecting material (transparent protecting film) and the like, which may be made of glass, resin, or a resin coating layer), a front display panel, a touch panel (made of glass or resin), or an ITO or ATO film or other transparent electrode layer. Needless to say, the displaying panel or touch panel surface may be further provided with an optical protecting material. Furthermore, the optical member may be a backlight unit itself containing a light emitting layer and a displaying surface (displaying panel) described later, or may be a member in which the entire optical member is an independent laminated member, or a module in a displaying device such as a touch panel or the like. The adhesive layer 15 made of the present cured product may be further provide inside the optical member. In other words, a concept of the optical member includes image displaying panels, optical panels, front surface panels, backlight units, touch panel units, and the like, as described later.

Materials of the optical members 20 and 21 are not particularly limited to those commonly used in the aforementioned applications, and examples thereof include glass, indium tin oxide (ITO), and other inorganic optical materials, polycarbonate resins, acrylic resins, epoxy resins, polystyrene resins, polyamide resins, polyimide resins, polyethylene resins, polypropylene resins, polyvinyl chloride resins, polyvinylidene chloride resins, polyvinyl alcohol (PVA) resins, polyethylene terephthalate (PET) resins, cyclopolyolefin resins, polyether ether ketone resins, polyethylene naphthalate (PEN) resins, liquid crystal polyarylate resins, polyamide imide resins, polyethersulfone resins, mixtures thereof, and other organic optical materials.

If heat resistance is particularly required, a polyimide resin, a polyetheretherketone resin, a polyethylene naphthalate (PEN) resin, a liquid crystal polyarylate resin, a polyamide imide resin, a polyethersulfone resin, a mixture thereof, or the like may be used.

On the other hand, in applications where visibility is required, such as display devices and the like, a polypropylene resin, a polystyrene resin, a polyvinylidene chloride resin, a PVA resin, a polycarbonate resin, a PET resin, a PEN resin, a mixture thereof, or the like may be used.

The optical members 20 and 21 may be subjected to a surface treatment generally applied thereto as a component of an optical display. The surface treatment may be, for example, a primer treatment, a corona treatment, or the like.

If the two optical members are mutually different, for example, the two optical members may peel at an adhesive interface due to a difference in thermal expansion coefficients of the two optical members. The present adhesive layer has flexibility, and therefore, an effect of the thermal expansion coefficient difference can be reduced, and the two mutually different optical members 20 and 21 can be favorably bonded. Therefore, the present adhesive phase is suitably used for adhering mutually different optical members, and particularly for adhering organic materials and inorganic materials that have a large difference in thermal expansion coefficient.

Note that although the laminate body 1 illustrated in FIG. 1 has two optical members, the number of optical members is not particularly limited so long as the laminate body has a plurality of optical members.

The adhesive layer 15 illustrated in FIG. 1 is formed entirely between the two optical members 20 and 21, but may also be formed in a portion between the two optical members 20 and 21. Furthermore, although the adhesive layer 15 illustrated in FIG. 2 is formed between the two optical members 20 and 21, the adhesive layer 15 may be formed on a surface 20b opposite from an adhesive surface 20a of the optical member 20, on a surface 21a opposite from an adhesive surface 21b of the optical member 21, or on both surfaces 20b and 21a.

A method of manufacturing a laminate body in an embodiment of the present invention will be described below.

FIG. 2 is a flowchart showing a method of manufacturing a laminate body in an embodiment of the present invention. The method of manufacturing a laminate body in the embodiment of the present invention includes: an arranging and adhering step S1 of arranging the aforementioned curable silicone composition, containing at least (c1) the hydrosilylation catalyst that exhibits activity without irradiating with a high energy beam, on one or two surfaces of at least one member of the two optical members, and then adhering the two optical members together via the curable silicone composition; and a curing step S2 of promoting a hydrosilylation reaction of the composition by allowing to stand or heating to cure the composition.

In the arranging step S1, the present composition is disposed on a member using the coating method described above, for example. In the arranging step S1, the present composition may be disposed on one surface of one of the optical members. Furthermore, the cured product disposed on two surfaces of the optical member and is not used for adhering with another optical member may be used as an adhesive surface for bonding to a release layer or another member.

Furthermore, in another embodiment, in the arranging step S1, the present composition may be disposed on one surface of each of the two optical members.

In the embodiment described above, "one surface" is a surface facing the other optical member.

Furthermore, in another embodiment, in the arranging step S1, the present composition may also be disposed on another surface positioned opposite from the one surface described above.

In the curing step S2, the present composition is cured in a low temperature region (15 to 80° C.) including room temperature (25° C.). Note that in the embodiments of the present invention, "low temperature" refers to a temperature range of, for example, 15° C. to 80° C. When the reaction of the present composition (including a semi-cured product) proceeds in the temperature range of 15 to 80° C., the present composition may suitably be left at or near room temperature range (a temperature range that can be reached without heating or cooling, particularly including a temperature range of 20 to 25° C.), may be cooled to 15° C. to room temperature, or may be heated to room temperature to 80° C.

A method of manufacturing a laminate body in another embodiment of the present invention includes: an arranging step S1 of arranging the aforementioned curable silicone composition containing at least (c2) the hydrosilylation catalyst that exhibits activity by irradiating with a high energy beam on one or two surfaces of at least one member of the two optical members, and then adhering the two optical members together via the curable silicone composition; and a curing step S2 of promoting a hydrosilylation reaction of the composition by allowing to stand or heating after irradiating with the high energy beam to cure the composition.

In the curing step S2, a high energy beam is irradiated. Thereby, the present cured product in which the present composition is cured is obtained. The high energy beam is as described above, and is preferably ultraviolet rays.

FIG. 3 is a flowchart showing a method of manufacturing a laminate body in yet another embodiment of the present invention. A method of manufacturing a laminate body in yet another embodiment of the present invention includes the following steps:

Step i): A step S1 of arranging the aforementioned curable silicone composition containing at least (c2) the hydrosilylation catalyst that exhibits activity by irradiating with a high energy beam, on one or two surfaces of at least one member of two optical members;

Step ii): A step S21 of performing high energy beam irradiation on the composition disposed in step i) to bring the composition into a non-fluid, semi-cured state;

Step iii): A step S3 of adhering together the two optical members via the curable silicone composition in a semi-cured state after step ii); and Step iv): A step S22 of promoting a hydrosilylation reaction of the composition within a temperature range of 15 to 80° C. for the two optical members adhered together in step iii) to main cure the composition.

In the semi-curing step S21, the present composition is irradiated with the high energy beam. Thereby, a semi-cured product in which a hydrosilylation reaction is promoted is obtained.

In the curing step S22, unlike the curing step S2 in FIG. 2, the semi-cured product is allowed to undergo a curing reaction within the temperature range of 15 to 80° C. to perform main curing. Thereby, the present cured in which the semi-cured product is further cured is obtained.

A method of manufacturing a laminate body in another embodiment of the present invention includes the following steps:

Step i): A step S1 of arranging the aforementioned curable silicone composition containing both (c1) the hydrosilylation catalyst that exhibits activity without irradiating with a high energy beam and (c2) the hydrosilylation catalyst that exhibits activity by irradiating with a high energy beam, on one or two surfaces of at least one member of two optical members, where a transparent optical member is used as the at least one member;

Step ii): A step S21 of promoting a hydrosilylation reaction of the composition by allowing the composition to stand at room temperature or heating the composition disposed in step i) to bring the composition into a non-fluid, semi-cured state;

Step iii): A step S3 of adhering together the two optical members via the curable silicone composition in a semi-cured state after step ii); and Step iv): A step S22 of performing high energy beam irradiation on the curable silicone composition via the transparent optical member, and then promoting a hydrosilylation reaction of the composition in a semi-cured state within a temperature range of 15 to 80° C., for the two optical members adhered together in step iii), to main cure the composition.

In the semi-curing step S21, the reaction of the present composition is allowed to proceed within the temperature range of 15 to 80° C. Thereby, a semi-cured product in which a hydrosilylation reaction is promoted is obtained.

In the curing step S22, unlike the curing process S2 in FIG. 2, the semi-cured product is irradiated with the high energy beam. Thereby, the present cured in which the semi-cured product is further cured is obtained.

A method of manufacturing a laminate body in another embodiment of the present invention includes the following steps:

Step i): A step S1 of arranging the aforementioned curable silicone composition containing at least (c1) the hydrosilylation catalyst that exhibits activity without irradiating with a high energy beam, on one or two surfaces of at least one member of two optical members;

Step ii): A step S21 of promoting a hydrosilylation reaction of the composition disposed in step i) within a temperature range of 15 to 80° C. to bring the composition into a non-fluid, semi-cured state;

Step iii): A step S3 of adhering together the two optical members via the curable silicone composition in a semi-cured state after step ii); and Step iv): A step S22 of further promoting a hydrosilylation reaction of the composition in a semi-cured state within a temperature range of 15 to 80° C. for the two optical members adhered together in step iii) to primarily cure the composition.

In the semi-curing step S21, the reaction of the present composition is allowed to proceed within the temperature range of 15 to 80° C. Thereby, a semi-cured product in which a hydrosilylation reaction is promoted is obtained.

In the curing step S22, unlike the curing step S2 in FIG. 2, the semi-cured product is further allowed to undergo a curing reaction within the temperature range of 15 to 80° C. to perform main curing. Thereby, the present cured in which the semi-cured product is further cured is obtained.

[Optical Device]

An optical device of an embodiment of the present invention (hereinafter may be referred to as "the present optical device") is provided with: a substrate; an optical element disposed on the substrate; and the present cured product that seals at least a part of the optical element.

The present optical device is, for example, an optical semiconductor device. Examples of optical semiconductor devices include light emitting diodes (LEDs), photocouplers, and CCDs. Examples of optical semiconductor elements include light emitting diode (LED) elements and solid state image sensing devices. In particular, the curable silicone composition of the present invention can be suitably used even when so-called Micro LEDs (mini LED) having a structure in which a large number of small LED elements are disposed on a substrate are collectively sealed. At this time, the refractive index of the cured product may be adjusted as desired by selecting the type of functional group, such as the amount of the aryl group and the like. Furthermore, the curable silicone composition of the present invention has excellent heat resistance and moisture resistance, and is therefore unlikely to cause a decrease in transparency and is unlikely to cause turbidity. This has the advantage of maintaining good light extraction efficiency of the optical semiconductor device containing the Micro LED.

An LED will be described below as an example of the present optical device, but the present optical device is not limited thereto. FIG. 4 is a plan view illustrating a Micro LED according to an embodiment of the present invention. FIG. 5 is a cross sectional view illustrating the Micro LED according to the embodiment of the present invention.

In an LED 100 illustrated in FIGS. 4 and 5, four rows and four columns of LED elements (optical elements) 101 are die-bonded onto a lead frame (substrate) 102, respectively, and the LED elements 101 and the lead frame 102 are wire-bonded by bonding wires 104 (not illustrated in FIG. 4). A frame material 105 is provided in a periphery of the LED elements 101, and the LED elements 101 inside the frame material 105 are sealed by the present cured product 106.

Note that in the Micro LED 100 illustrated in FIGS. 4 and 5, four rows and four columns of LED elements are sealed in the present cured product, but the number and arrangement of the LED elements are not limited thereto. Furthermore, the curable silicone composition of the embodiment of the present invention is also applicable as an sealing material in a single surface mount type LED.

FIG. 6 is a cross sectional view illustrating a Micro LED 100A according to another embodiment of the present invention.

The LED element 101 is disposed on the substrate 102. The LED element 101 may optionally be disposed on the substrate 102 via an adhesive layer. The LED element 101 is sealed by the present cured product 106.

The substrate 102 may optionally be provided with an electrode, and another optical element or member may be disposed on a surface and inside of the substrate 102.

A surface layer 103 is disposed on an opposite side of the substrate 102 with respect to the present cured product 106. The surface layer 103 is a transparent layer, such as glass, PET, or the like, which may be a plurality of layers, and may be internally provided with a transparent adhesive layer. Note that the transparent adhesive layer may be the present cured product.

FIG. 7 is a cross sectional view of a Micro LED 100B in which a set of red (R), green (G), and blue (B) light emitting elements are arranged on a lead frame according to an embodiment of the present invention. For example, as illustrated in FIG. 7, three types of light emitting semiconductor (LED) elements 101R, 101G, and 101B corresponding to the three primary colors of light, red (R), green (G), and blue (B), are disposed on the lead frame 102 as a set, and can be sealed by the present cured product 106 using or not using a frame material.

A method of manufacturing the present optical device includes either:

an arranging step S1 of heating the present composition to obtain a composition in which the hydrosilylation reaction has proceeded, and then arranging the heated composition on an optical element disposed on a substrate; or a heating step of arranging the present composition on an optical element disposed on a substrate to obtain a composition in which a hydrosilylation reaction has proceeded; and further includes:

a curing step of irradiating a high energy beam to cure the heated composition.

Note that in the arranging step S1 of the method of manufacturing the present optical device, instead of heating the present composition, a composition in which the hydrosilylation reaction has proceeded can be obtained by allowing the present composition to stand in a low temperature region (15 the 80° C.) including room temperature, and then arranging the composition on the optical element arranged on the substrate.

As a method of manufacturing the Micro LED illustrated in FIGS. 4 and 5, first, the four LED elements 101 are die-bonded to the lead frame 102, and then the LED elements 101 and the lead frame 102 are wire bonded together by a gold bonding wire 104.

Next, the present composition is filled (arranged) inside the frame material 105 provided in a periphery the four LED elements 101, and then allowed to stand at 0 to 200° C. to cure. In another embodiment of the present invention, after the present composition has been allowed to stand at 0 to 200° C., the composition is arranged inside the frame material 105 provided in a periphery of the LED elements 101.

Furthermore, the composition is cured after heating by irradiating with the high energy beam. In this manner, the LED 100 in which the four LED elements 101 are sealed by the present cured product 106 can be obtained.

[Optical Display]

FIG. 8 is a cross sectional view illustrating an optical display of an embodiment of the present invention. An optical display 200 of an embodiment of the present invention is provided with the aforementioned laminate body 1 and an image displaying panel 201.

The laminate body 1 and the image displaying panel 201 are adhered bother via an adhesive layer (not illustrated). The adhesive layer may be configured from the present cured product.

In the optical display 200 illustrated in FIG. 8, the second optical member 21 of the laminate body 1 is in contact with the adhesive layer. In the optical display 200 illustrated in FIG. 8, for example, the first optical member 20 of the laminate body 1 can be a polarizing film and the second optical member 21 can be a phase difference film. Furthermore, in another embodiment, for example, the first optical member 20 of the laminate body 1 can be a polarizing film and the second optical member 21 can be a surface protective film.

The image displaying panel 201 is not particularly limited so long as image information is displayed. For example, in the case of a liquid crystal display (LCD), the image displaying panel 201 is configured from a polarizing film, a phase difference film, a color filter, an enlarged viewing angle film, a brightness enhancing film, a reflection sheet, or other optical film, a liquid crystal material, a transparent substrate, and a backlight system (Normally, an adhering surface of a pressure sensitive adhesive component or a pressure sensitive adhesive layer to the image displaying panel is an optical film). There are STN, VA, IPS, and other systems depending on a control system of a liquid crystal material, but any method may be used. Furthermore, the image displaying panel 201 may be an in-cell type in which a touch panel function is internally provided in a TFT-LCD, or an on-cell type in which a touch panel function is internally provided between a polarizing plate and a glass substrate provided with a color filter. On the other hand, in the case of an organic LED display, the image displaying panel 201 is configured from an organic LED element substrate or a laminate body of an organic LED element substrate and another optical film and the like.

The optical display 200 can be a cathode ray tube (CRT) display or a flat panel display (FPD). Examples of FPDs include LCDs, electrochromic displays (ECD), and other light receiving display devices, organic EL displays, inorganic EL displays, and other field emitting displays (ELD), plasma displays (PDP), surface conducting electron emitter displays (SED), and other field emission displays (FED), and LED displays and other light emitting display devices.

FIG. 9 is a cross sectional view illustrating an optical display of another embodiment of the present invention. An optical display 300A of another embodiment of the present invention is provided with: an image displaying panel 301; the optical member 20; and the adhesive layer 15 made of the present cured product disposed between the image displaying panel 301 and the optical member 20.

The image displaying panel 301 is a first member, and the optical member 20 is a second member.

The image displaying panel 301 can be the image displaying panel exemplified by the image displaying panel 201.

The optical display 300A can be obtained, for example, by arranging the optical member 20 on one surface 301a of the image displaying panel 301 via a composition layer made from the present composition, semi-curing the composition layer within a temperature range of 15 to 80° C., and then further curing the composition layer by irradiating the composition layer with a high energy beam. Note that the process of semi-curing within the temperature range of 15 to 80° C. may be replaced by irradiation with a high energy beam, and the process of curing by irradiation with a high energy beam can be replaced with a process of curing within a temperature range of 15 to 80° C.

In another embodiment of the present invention, for example, a composition layer made from the present composition formed on one surface 20a of the optical member 20 is semi-cured within a temperature range of 15 to 80° C., the optical member 20 is arranged on the one surface 301a of the image displaying panel 301 via the semi-cured composition layer, and then the composition layer is further cured by irradiating the composition layer with a high energy beam. Note that the process of semi-curing within the temperature range of 15 to 80° C. may be replaced by irradiation with a high energy beam, and the process of curing by irradiation with a high energy beam can be replaced with a process of curing within a temperature range of 15 to 80° C.

FIG. 10 is a cross sectional view illustrating an optical display of another embodiment of the present invention. An optical display 300 B of another embodiment of the present invention is provided with: the image displaying panel 301; a touch panel 302; and the adhesive layer 15 made from the present cured product disposed between the image displaying panel 301 and the touch panel 302.

The touch panel 302 is not particularly limited and may be any of a resistive film system, a capacitive system, an electromagnetic induction system, a combination thereof, and the like. The touch panel 302 is preferably provided with at least one of transparent electrode layer such as a cover film, ITO, ATO film, or the like, or a glass substrate. The touch panel may further contain a decorative film or the like.

In the optical display of an embodiment of the present invention, the visibility of the optical display can be enhanced by adhering or pressure sensitive adhering between a displaying part such as a liquid crystal/organic EL or the like and a display forming member such as a touch panel, cover lens, or the like or between display forming members via the cured product of the curable silicone composition of the present invention.

The image displaying surface of the display may be flat, curved, or flexed.

The optical display of an embodiment of the present invention may be used, for example, in mobile phones, fixed-line phones, and other communicating devices; tablets, desktops, notebook terminals, and other computer devices; TVs; printers; ATMs (automated teller machines); in-vehicle monitors and navigation systems; digital cameras; video cameras; medical equipment; PDAs (mobile terminals); clocks; electronic papers; CDs, DVDs, and Blue-ray disc players; SSMs, HDs, and other solid-state electronic storage media players; electronic book devices; portable game devices, fixed game devices, and other gaming devices; POS systems; fish finders; automatic ticket vending machine; instrument panels; and other applications.

Furthermore, the optical display of an embodiment of the present invention may, in addition to the aforementioned configurations, be provided with: a first member, which is any one of a first optical member, an image displaying panel, or a first touch panel; a second member, which is any one of a second optical member, a transparent protective member, or a second touch panel; and an adhesive layer made from the present cured product disposed between the first member and the second member.

Specifically, as necessary, a resin member, a so-called dam material, can be formed into a frame shape in a displaying module, an optical elastic resin (hereinafter referred to as "optically clear resin (OCR)") can be coated therein, and a front surface panel can be adhered from above. Furthermore, depending on the site to be injected or arranged, a dispenser such as a syringe, a cartridge, or the like may be used to inject and fill the curable silicone composition according to the present invention, and the OCR may be arranged. Furthermore, depending on the structure of the displaying module and the viscosity and application form of the OCR, a dam material may be provided only in a part of the displaying module, or may be adhered by the OCR as a structure in which the dam material is not provided at all, that is, a so-called damless structure.

Note that for an OCR coating step (in the case of optical bonding), an adhering step, or the like, which are necessary for manufacturing a displaying device having a front surface panel, a conventionally known adhering method under an atmospheric pressure environment may be adopted without limiting to the aforementioned reduced pressure environment. Examples include: a method coating OCR to a front surface panel side under an atmospheric pressure environment, reversing and adhering the front surface panel to a displaying module (reversed adhering method); a method of arranging a front surface panel and a displaying module in parallel with a predetermined gap therebetween and then filling OCR between the gaps (gap dispensing method); and the like.

Typical methods for producing optical displays of the present invention may include, for example, a dam fill method. Specifically, a dam material is dispensed to a width of than 1 mm or less in accordance with the shape of the display on an organic optical resin, such as glass or polycarbonate used as a cover lens, and cured by various methods. Subsequently, a method for producing an optical display is exemplified, wherein the curable silicone composition of the present invention is dispensed and the image display panel is bonded together, then heated at relatively low temperatures (for example, 40° C.) to cure the silicone composition.

Here, a UV curable, room temperature curable, or heat-curable liquid material having thixotropic properties can be used as the dam material. UV curable silicone materials can be preferably used in view of their high resistance to thermal shock (a so-called thermal cycle).

Furthermore, the optical display of the present invention is rapidly cured at relatively low temperatures, specifically at temperatures of 40° C. or lower, and therefore tends not to cause deformation and deterioration of a thermally unstable material, along with clouding and discoloration even if exposed to high temperatures and high humidity, enabling improvements in the reliability of the optical display.

An optical display of an embodiment of the present invention may further be a displaying device provided with:
- a shield substrate provided on a surface of the front surface panel facing the displaying surface and having a surface on which a transparent conductive film is formed; and provided with:
- a structure in which the transparent conductive film and the bezel are electrically connected via a conductive material.

For example, in a displaying device, a shield substrate such as an electro-magnetic interference (EMI) substrate and the like with a conductive layer on one surface can be further inserted between the displaying module and the front surface panel. The shield substrate has an electromagnetic wave shielding function, and therefore prevents the front surface panel from malfunctioning due to electromagnetic waves radiating from the displaying module. Furthermore, a conductive layer made from a transparent conductive film such as ITO or the like is formed uniformly or in a mesh-like manner on one surface of the shield substrate. Furthermore, in order to set the potential of the conductive layer to a GND of the displaying module, an adhesive member or the like disposed in an outer periphery of the bezel can be formed by a conductive adhesive member such as Ag paste or the like, for example. Note that the bezel of the displaying module is made from a metal and is connected to the GND in the displaying module. Herein, by using a conductive material as the adhesive member, the metal bezel and the conductive layer of the shield substrate can be securely connected to the GND, thereby providing a displaying device with strong electromagnetic wave resistance.

FIG. 11 is an exploded perspective view illustrating an optical display of another embodiment of the present invention. FIG. 12 is a partial cross sectional view illustrating an optical display of another embodiment of the present invention, and is a cross sectional view of the optical display illustrated in FIG. 11.

As illustrated in FIGS. 11 and 12, a displaying device 400 (optical display) according to the present invention is provided with: a displaying panel 110 having a displaying surface 111; a bezel 120 having a frame part 121 and an opening end 122 inside the frame part 121 and covering a circumferential edge on the displaying surface 111 side of the displaying panel 110 by the frame part 121; a front surface panel 130 provided sandwiching the bezel 120 against the displaying surface 111 side of the display panel 110, a resin member 140 that is directly below the opening end 122 of the bezel 120 and fills a gap 172 generated at an overlapping portion between the bezel 120 and the displaying surface 111 in a direction orthogonal to the displaying surface 111 without any gaps, and an OCR 150 filled between the displaying surface 111 and the front surface panel 130. Herein, the displaying surface 111 refers to an entire surface of the displaying panel 110 on the front surface panel 130 side.

The displaying panel 110 is mounted on a backlight unit 171, and the bezel 120 and the backlight unit 171 are secured by a mating structure (not illustrated) to configure a displaying module 170. Entire surfaces of the displaying module 170 and the front surface panel 130, such as the touch panel or the like, are all adhered together via the OCR 150.

In the embodiment of the present invention, the curable silicone composition of the present invention can be applied to an inner layer of the front surface panel 130, OCR 150, resin member 140 under the bezel, and the like. Note that although not limited to these applications, the curable silicone compositions of the present invention can be used for bonding and for filling in or between the members illustrated in FIGS. 11 and 12.

FIGS. 13 to 15 are partial cross sectional views illustrating optical displays of other embodiments of the present invention. Note that FIGS. 13 to 15 are diagrams corresponding to FIG. 12.

The partial cross sectional view illustrated in FIG. 13 illustrates a structure in which a dam (resin member) 140 is further provided on the bezel 120 illustrated in FIG. 12, and a space 173 between the bezel 120 and the front surface panel 130 is filled with the OCR 150 made from the present cured product, a so-called two-level dam structure.

Furthermore, the bezel 120 illustrated in FIGS. 11 to 13 is not essential. The partial cross sectional view illustrated in FIG. 14 illustrates a structure in which the dam 140 is provided on a backlight unit 170A and a space 173 between the backlight unit 170A and the front surface panel 130 is filled with the OCR 150 made from the present cured product, without arranging the bezel 120.

Furthermore, the partial cross sectional view illustrated in FIG. 14 illustrates a structure in which the space 173 between the bezel 120 and the front surface panel 130 is filled with the OCR 150 made from the present cured product without the bezel 120 and the dam 140, the so-called damless structure. The structure illustrated in FIG. 14 can be achieved by making the composition non-fluid during semi-curing.

SUMMARY

The displaying device is preferably a displaying device having a structure in which the space between the displaying surface and the front surface panel is filled by a substantially transparent optical elastic resin member or an optical gel-like resin member. By using the optical elastic resin member or optical gel-like resin member as an OCR for optical bonding, the display performance and durability of the displaying device can be improved, and thus a highly reliable displaying device can be provided.

The OCR is preferably obtained by curing the curable resin composition, and examples include silicone resin cured products (member) having the physical properties of the aforementioned degree of needle penetration, shear adhesive strength, and the ratio of displacement to sample thickness at maximum adhesive strength, and formed by photocuring including irradiating with UV light.

Furthermore, the present composition has excellent durability at low temperatures and can obtain a cured product with excellent transparency. Therefore, for example, it is possible to provide a highly reliable laminate body, an optical device, and an optical display in an operating environment such as in winter, cold regions, and the like. In particular, the cured product obtained by curing the present composition contains a certain amount of aryl groups bonded to atoms in silicon in the composition. Furthermore, the aryl groups are dispersed in a state of high compatibility with another curable component, and a heterogeneous molecular sequence derived from the aryl group is randomly introduced in the highly transparent cured product. As a result, as compared with a case where the cured product essentially does not contain an aryl group or a main molecular structure of the cured product is a silicon atom aryl group as a result of containing a large amount of aryl group, change in the elastic modulus of the cured product is suppressed even at a low temperature, and cold resistance is improved. At the same time, the reliability and low temperature durability are improved in electronic components such as optical devices, optical displays, and the like provided with the curable organopolysiloxane composition or the cured product thereof.

Furthermore, the present invention does not preclude the adoption of a structure in which an additional dam material is provided on an outer side of the silicone resin member filling the gap between the bezel and the displaying panel as a dam material to partially or completely block the gap, provided that a technical effect of the present invention is not impaired. For example, if a special shape is adopted for a part of the bezel for design reasons and the gap cannot be completely closed using the method described above, the curable resin composition serving as a dam material may be injected pinpointly in the point.

Furthermore, although the shape of the front surface panel has been described as a rectangular shape, the shape does not need to be a rectangle, but may be an arbitrary polygon, a flat plate having a curved portion, or a combination thereof, and may even be a three-dimensional shape.

INDUSTRIAL APPLICABILITY

The curable silicone composition of the present invention has excellent transparency and adhesive properties, and also has excellent durability (cold resistance) at low temperatures. Moreover, cracking of the cured product or a decrease in the elastic modulus do no occur even when used at low temperatures. Therefore, the composition is suitable for an adhering step and the like in the manufacture of optical displays and touch panels. Furthermore, the product thereof has high transparency and excellent adhesive strength, and therefore can be suitably used for optical displays and touch panels. Furthermore, as described above, the image displaying surface of the display may be flat, curved, or flexed.

The curable silicone composition of the present invention has excellent curability and high cold resistance, and maintains transparency even when exposed to high temperature and high humidity. Moreover, the composition forms a cured product that is less likely to become turbid or discolored, and therefore is useful as an adhesive or a pressure sensitive adhesive for use in displaying devices such as optical displays and the like (including touch panels) and optical semiconductor devices (including Micro LEDs). Furthermore, the curable silicone composition of the present invention can be used without limitation for adhering or filling a transparent member, not limited to optical displays and the like. For example, the curable silicone composition can be used in solar cells, multi-layer glass (smart glass), optical waveguide, projector lens (multi-layer lens, polarizing/optical film adhering), and the like.

In addition thereto, the curable silicone composition of the present invention has a general advantage of silicone OCR, where curing shrinkage of the cured product is small, and thus display defects, such as defects in displays and optical components, unevenness in images, and the like, can be suppressed. In addition thereto, the curable silicone composition of the present invention has high followability to an adhesive member due to the flexible nature described above, and expresses a strong adhesive force after a certain period of time passes. Therefore, the curable silicone composition of the present invention effectively suppresses peeling between members, and can be suitably used for optical adhesive layers such as in-vehicle displays having flat or curved displaying surfaces, head-up displays utilizing the projector lens described above, and the like.

EXAMPLES

The present invention will be described in detail below based on examples, but the present invention is not limited to the examples. Furthermore, measurements and evaluations in the examples were conducted as follows.

[Degree of Needle Penetration of Cured Product]

A curable silicone composition with a thickness of 10 mm or more was left to stand to cure for 48 hours at 25° C. in a petri dish, and the degree of needle penetration at 25° C. was measured using a needle penetration measuring device (RPM-201 manufactured by Rigo Co., Ltd.).

[Shear Adhesive Strength of Cured Product]

A curable silicone composition was filled and heated in an oven at 40° C. for one hour such that the dimensions of the cured silicone cured product were a length of 25 mm×width of 25 mm×thickness of 200 μm between two glass plates (length of 75 mm×width of 25 mm×thickness of 2 mm), to cure the composition by heating at room temperature for 48 hours so as to prepare a test piece containing a cured product sandwiched between the two glass plates. The test piece was subjected to a shear adhesion test in accordance with a method specified in JIS K6850, and the adhesive strength was measured.

[Appearance of Cured Product]

A test piece filled with a curable silicone composition was allowed to stand for 48 hours at 25° C. such that the dimensions of the cured silicone cured product were a length of 25 mm×width of 25 mm×thickness of 200 μm between two glass plates (length of 75 mm×width of 25 mm×thickness of 2 mm). The cured products were left to stand in a freezer at −55° C. for 500 hours, returned to room temperature for approximately 2 hours, and then maintained at −55° C. and 85° C. for 30 minutes in a cold cycle testing machine, which was repeated 200 times. Thereafter, the appearance thereof was visually observed. As a result, clear cracking was observed.

Examples 1 to 4 and Comparative Examples 1 to 4

The curable silicone compositions were prepared at the compositions (parts by weight) shown in Table 1 using the following components. In each structural formula, Me represents a methyl group, Vi represents a vinyl group, Ph represents a phenyl group, and Ep represents an epoxy group.

The following component was used as component (A).
a1-1: $ViMe_2SiO(SiMe_2O)_{233}(SiMePhO)_{24}OSiMe_2Vi$
a1-2: $ViMe_2SiO(SiMe_2O)_{240}(SiMePhO)_{17}OSiMe_2Vi$
a1-3: $ViMe_2SiO(SiMe_2O)_{203}(SiMePhO)_{50}OSiMe_2Vi$
a1'-1(Comparative component): $ViMe_2SiO(SiMe_2O)_{372}OSiMe_2Vi$
a1'-2(Comparative component): $ViMe_2SiO(SiMe_2O)_{80}(SiMePhO)_{80}OSiMe_2Vi$
a1'-3(Comparative component): $ViMe_2SiO(SiMe_2O)_{256}(SiMePhO)_{4}OSiMe_2Vi$
a2-1: $(ViMe_2SiO_{1/2})_{0.046}(Me_3SiO_{1/2})_{0.394}(SiO4/2)_{0.56}$
a2-2: $Si(OSiMe_2Vi)_4$ The following component was used as component (B).
b1-1: $HMe_2SiO(SiMe_2O)_{24}OSiMe_2H$
b2-1: $(HMe_2SiO_{1/2})_{0.63}(SiO_{4/2})_{0.37}$
b2-2: $(HMe_2SiO_{1/2})_{0.75}(PhSiO_{3/2})_{0.25}$ The following component was used as component (C).
c1-1: Platinum 1,3-divinyl-1,1,3,3-tetramethyldisiloxane complex The following component was used as component (D).
d1-1: 1,6-bis(trimethoxysilyl) hexane
d1-2: 1,3-bis(trimethoxysilylethyl) tetramethyldisiloxane The following components were used as other optional components.
Optional component-1: $Me_3SiO(SiMe_2O)_{450}(SiMePhO)_{40}OSiMe_3$

TABLE 1

|  |  | Examples | | | |
|---|---|---|---|---|---|
|  |  | 1 | 2 | 3 | 4 |
| A | a1-1 | 86.45 | 88.07 | — | — |
|  | a1-2 | — | — | 88.80 | — |
|  | a1-3 | — | — | — | 91.75 |
|  | a2-1 | 1.75 | — | 3.5 | 1.75 |
|  | a2-2 | — | 0.13 | — | — |
| Comparative component A | a1'-1 | — | — | — | — |
|  | a1'-2 | — | — | — | — |
|  | a1'-3 | — | — | — | — |
| B | b1-1 | 6 | 6 | 7.5 | 6.3 |
|  | b2-1 | — | — | — | — |
|  | b2-2 | 0.1 | 0.1 | — | — |
| C | c1-1 | 0.001 | 0.001 | 0.001 | 0.001 |
| D | d1-1 | 0.2 | — | 0.2 | 0.2 |
|  | d1-2 | — | 0.2 | — | — |
| Optional Components |  | 5.5 | 5.5 | — | — |
|  |  | 100.00 | 100.00 | 100.00 | 100.00 |
| Number of mols of silicon-bonded hydrogen atoms in component B to one mol of alkenyl groups in component A |  | 0.87 | 0.85 | 0.86 | 0.84 |
| Mol % of aryl groups in component a1 or component equivalent to a1 |  | 4.3 | 4.3 | 3.3 | 9.8 |
| Mol % of aryl groups in all silicon-bonded organic groups of the composition |  | 4.2 | 4.3 | 2.9 | 8.9 |

TABLE 1-continued

|  |  | | | | |
|---|---|---|---|---|---|
| Degree of needle penetration | | 35 | 37 | 40 | 39 |
| Shear adhesive strength after curing at 25° C. for 48 hours | | 0.38 | 0.4 | 0.37 | 0.32 |
| Appearance of laminate sample after allowing to stand at −55° C. for 500 hours | | No change | No change | No change | No change |
| Appearance of sample after 200 cycles of a −55° C./85° C. cold cycle | | No change | No change | No change | No change |

|  |  | Comparative Examples | | | |
|---|---|---|---|---|---|
|  |  | 1 | 2 | 3 | 4 |
| A | a1-1 | — | — | — | — |
|  | a1-2 | — | — | — | — |
|  | a1-3 | — | — | — | — |
|  | a2-1 | 3.5 | 3.5 | 1.75 | 1.75 |
|  | a2-2 | — | — | — | — |
| Comparative component A | a1'-1 | — | — | 90.6 | 90.6 |
|  | a1'-2 | 81.06 | — | — | — |
|  | a1'-3 | — | 83.56 | — | — |
| B | b1-1 | 8 | 7.3 | 4 | 6 |
|  | b2-1 | — | — | 0.08 | 0.3 |
|  | b2-2 | — | — | — | — |
| C | c1-1 | 0.0005 | 0.0005 | 0.0005 | 0.0005 |
| D | d1-1 | 0.2 | 0.2 | 0.2 | 0.2 |
|  | d1-2 | — | — | — | — |
| Optional Components | | 5.24 | 5.24 | 5.00 | — |
|  | | 92.76 | 94.56 | 96.63 | 98.85 |
| Number of mols of silicon-bonded hydrogen atoms in component B to one mol of alkenyl groups in component A | | 0.86 | 0.86 | 0.76 | 1.37 |
| Mol % of aryl groups in component a1 or component equivalent to a1 | | 24.5 | 0.76 | 0.0 | 0.0 |
| Mol % of aryl groups in all silicon-bonded organic groups of the composition | | 19.6 | 0.85 | 0.19 | 0.0 |
| Degree of needle penetration | | 40 | 38 | 49 | 25 |
| Shear adhesive strength after curing at 25° C. for 48 hours | | 0.2 | 0.45 | 0.5 | 0.52 |
| Appearance of laminate sample after allowing to stand at −55° C. for 500 hours | | Cracking occurs | Cracking occurs | Cracking occurs | Cracking occurs |
| Appearance of sample after 200 cycles of a −55° C./85° C. cold cycle | | Cracking occurs | Cracking occurs | Cracking occurs | Cracking occurs |

In Examples 1 to 4, in which the component containing an aryl group of the present invention was used and the configuration of the present invention was satisfied, cured products (from flexible elastomeric to gel-like, and the like) having excellent transparency and adhesive strength sufficient for practical use could be obtained. Furthermore, the laminate samples containing the cured product maintained favorable appearance without cracking even after being allowed to stand at a low temperature of −55° C. or after 200 cycles of the −55° C./85° C. cold cycle. Therefore, the cured product using the curable silicone composition of the present invention has excellent cold resistance, does not lose elasticity even under low temperature conditions, is transparent, and has excellent adhesive properties.

On the other hand, all of the Comparative Examples that do not satisfy the configuration of the present invention were confirmed to have cracking occur after being allowed to stand at a low temperature of −55° C., and thus cold resistance was not sufficient.

REFERENCE NUMERALS

1 Laminate body
15 Adhesive layer
20 First optical member
20a Connection surface
20b Surface
21 Second optical member
21a Surface
21b Surface
100, 100A LED
101, 101B, 101G, 101R LED element (optical element)
102 Lead frame (substrate)
103 Transparent layer
104 Bonding wire
105 Frame material
106 The cured product
110 Displaying panel
111 Displaying surface
120 Bezel
121 Frame part
122 Opening end
130 front surface panel
140 Resin member (dam)
150 OCR
170, 170A Displaying module
171 Backlight unit
172 Gap 173 Space
200 Optical display
201 Image displaying panel
300A Optical display
300B Optical display
301 Image displaying panel
301a Surface
302 Touch panel
400 Display device (optical display)

The invention claimed is:

1. A curable silicone composition, comprising:
(A) an organopolysiloxane having in a molecule at least 2 alkenyl groups each with 2 to 12 carbon atoms, and comprising the following components (a1) and (a2) where component (a2) is different from component (a1);
  (a1) a straight chain or branched organopolysiloxane having in one molecule at least 2 alkenyl groups with 2 to 12 carbon atoms, where 3 to 25 mol % of silicon-bonded organic groups are aryl groups, and
  (a2) an organopolysiloxane having an alkenyl group, as expressed by average unit formula: $(R^1{}_3SiO_{1/2})_a(R^1{}_2SiO_{2/2})_b(R^1SiO_{3/2})_c(SiO_{4/2})_d$, where $R^1$ independently represents a monovalent hydrocarbon group with 1 to 12 carbon atoms, at least 1 mol % of $R^1$ are alkenyl groups with 2 to 12 carbon atoms, and a, b, c and d satisfy all of the following conditions: $(a+b+c+d)=1$, $0 \leq a \leq 0.8$, $0 \leq b \leq 0.4$, $0 \leq c \leq 0.8$, $0 \leq d \leq 0.6$, and $0.2 \leq (c+d) \leq 0.8$;
(B) an organohydrogenpolysiloxane having at least 2 silicon-bonded hydrogen atoms per molecule, and comprising the following components (b1) and (b2) where component (b2) is different from component (b1);
  (b1) a straight chain organohydrogenpolysiloxane having at least one silicon-bonded hydrogen atom on one or more ends of a molecular chain, and
  (b2) an organohydrogenpolysiloxane having 3 or more silicon-bonded hydrogen atoms in one molecule;
(C) a hydrosilylation reaction catalyst; and
(D) an organic compound having two or more alkoxysilyl groups in one molecule;
wherein:
i) the amount of component (a2) is within a range of 0.5 to 10 mass %, and the amount of component (b2) is within a range of 0.001 to 2.0 mass %, each relative to the sum of non-volatile components of the curable silicone composition;
ii) component (B) is present in an amount such that the silicon-bonded hydrogen atoms in component (B) are 0.5 to 2 mol per 1 mol of aliphatic unsaturated carbon-carbon bonds in component (A);
iii) the amount of component (D) is within a range of 0.001 to 5 mass %, the amount of a polyether compound is 0.1 mass % or less, and the amount of a compound having an epoxy group and alkoxysilyl group is 0.1 mass % or less, each relative to the total amount of the curable silicone composition;
iv) 2 to 20 mol % of the silicon-bonded organic groups in component (A) are aryl groups, and 2 to 17.5 mol % of the silicon-bonded organic groups in the curable silicone composition are aryl groups; and
v) at least one of provisos I) or II) is true:
I)
  wherein component (a1) is selected from:
    (a1-1) $ViMe_2SiO(SiMe_2O)_{233}(SiMePhO)_{24}OSiMe_2Vi$;
    (a1-2) $ViMe_2SiO(SiMe_2O)_{240}(SiMePhO)_{17}OSiMe_2Vi$; or
    (a1-3) $ViMe_2SiO(SiMe_2O)_{203}(SiMePhO)_{50}OSiMe_2Vi$; and
  wherein component (a2) is selected from:
    (a2-1) $(ViMe_2SiO_{1/2})_{0.046}(Me_3SiO_{1/2})_{0.394}(SiO_{4/2})_{0.56}$; or
    (a2-2) $Si(OSiMe_2Vi)_4$;
II)
  wherein component (b1) is:
    (b1-1) $HMe_2SiO(SiMe_2O)_{24}OSiMe_2H$; and
  wherein component (b2) is selected from:
    (b2-1) $(HMe_2SiO_{1/2})_{0.63}(SiO_{4/2})_{0.37}$; or
    (b2-2) $(HMe_2SiO_{1/2})_{0.75}(PhSi)_{3/2})_{0.25}$.

2. The curable silicone composition according to claim 1, wherein 2 to 17.5 mol % of the silicon-bonded organic groups in component (A) are aryl groups.

3. The curable silicone composition according to claim 1, wherein proviso I) is true such that component (a1) is selected from:
  (a1-1) $ViMe_2SiO(SiMe_2O)_{233}(SiMePhO)_{24}OSiMe_2Vi$;
  (a1-2) $ViMe_2SiO(SiMe_2O)_{240}(SiMePhO)_{17}OSiMe_2Vi$; or
  (a1-3) $ViMe_2SiO(SiMe_2O)_{203}(SiMePhO)_{50}OSiMe_2Vi$; and
wherein component (a2) is selected from:
  (a2-1) $(ViMe_2SiO_{1/2})_{0.046}(Me_3SiO_{1/2})_{0.394}(SiO_{4/2})_{0.56}$; or
  (a2-2) $Si(OSiMe_2Vi)_4$.

4. The curable silicone composition according to claim 1, wherein;
the amount of component (a2) is within a range of 0.5 to 5.0 mass %, and
the amount of component (b2) is within a range of 0.01 to 1.0 mass %,
each relative to the sum of non-volatile components of the curable silicone composition.

5. The curable silicone composition according to claim 1, further comprising:
(E) a plasticizer or viscosity modifier.

6. The curable silicone composition according to claim 1, wherein component (D) comprises:
  (d1) an organic compound having at least two alkoxysilyl groups at one or more ends of a molecular chain.

7. The curable silicone composition according to claim 1, wherein proviso II) is true such that component (b1) is:
  (b1-1) $HMe_2SiO(SiMe_2O)_{24}OSiMe_2H$; and
wherein component (b2) is selected from:
  (b2-1) $(HMe_2SiO_{1/2})_{0.63}(SiO_{4/2})_{0.37}$; or
  (b2-2) $(HMe_2SiO_{1/2})_{0.75}(PhSi)_{3/2})_{0.25}$.

8. The curable silicone composition according to claim 1, wherein component (C) is selected from the group consisting of:
  (c1) a hydrosilylation reaction catalyst that exhibits active activity without irradiating with a high energy beam;
  (c2) a hydrosilylation reaction catalyst that exhibits activity by irradiating with a high energy beam; and
  (c3) a hydrosilylation reaction catalyst that is a combination of component (c1) and component (c2).

9. The curable silicone composition according to claim 8, wherein the high energy beam is selected from the group consisting of ultraviolet rays, gamma rays, X-rays, alpha rays, and electron beams.

10. The curable silicone composition according to claim 6, wherein component (d1) is selected from:
  (d1-1) 1,6-bis(trimethoxysilyl) hexane; or
  (d1-2) 1,3-bis(trimethoxysilylethyl) tetramethyldisiloxane.

11. A cured product of the curable silicone composition according to claim 1.

12. The cured product according to claim 11, wherein the degree of needle penetration according to JIS K2220 at 25° C. is within a range of 5 to 70.

13. A laminate body, comprising:
an adhesive layer comprising the cured product according to claim 11, disposed between a first transparent or non-transparent optical member and a second transparent or non-transparent optical member.

14. An optical device, comprising:
a substrate;
an optical element disposed on the substrate;
the cured product according to claim 11, that seals at least a portion of the optical element.

15. An optical display, comprising the laminate body according to claim 13.

16. A method of manufacturing a laminate body, comprising:
arranging the curable silicone composition according to claim 8, comprising at least (c1) the hydrosilylation catalyst that exhibits activity without irradiating with a high energy beam, on one or two surfaces of at least one member of two optical members, and then adhering the two optical members together via the curable silicone composition; and
promoting a hydrosilylation reaction of the composition by allowing to stand or heating to cure the composition.

17. A method of manufacturing a laminate body, comprising:
arranging the curable silicone composition according to claim 8, comprising at least (c2) the hydrosilylation catalyst that exhibits activity by irradiating with a high energy beam, on one or two surfaces of at least one member of two optical members, and then adhering the two optical members together via the curable silicone composition; and
promoting a hydrosilylation reaction of the composition by allowing to stand or heating after irradiating with the high energy beam to cure the composition.

18. A method of manufacturing a laminate body, comprising the following steps:
i) arranging the curable silicone composition according to claim 8, comprising at least (c2) the hydrosilylation catalyst that exhibits activity by irradiating with a high energy beam, on one or two surfaces of at least one member of two optical members;
ii) performing high energy beam irradiation on the composition disposed in step i) to bring the composition into a non-fluid, semi-cured state;
iii) adhering together the two optical members via the curable silicone composition in the non-fluid, semi-cured state after step ii); and
iv) promoting a hydrosilylation reaction of the composition in the non-fluid, semi-cured state within a temperature range of 15 to 80° C. for the two optical members adhered together in step iii), to fully cure the composition.

19. A method of manufacturing a laminate body, comprising the following steps:
i) arranging the curable silicone composition according to claim 8, comprising both (c1) the hydrosilylation catalyst that exhibits activity without irradiating with a high energy beam and (c2) the hydrosilylation catalyst that exhibits activity by irradiating with a high energy beam, on one or two surfaces of at least one member of two optical members, where a transparent optical member is used as the at least one member;
ii) promoting a hydrosilylation reaction of the composition disposed in step i) within a temperature range of 15 to 80° C. to bring the composition into a non-fluid, semi-cured state;
iii) adhering together the two optical members via the curable silicone composition in the non-fluid, semi-cured state after step ii); and
iv) performing high energy beam irradiation on the curable silicone composition via the transparent optical member, and then further promoting the hydrosilylation reaction of the composition in the non-fluid, semi-cured state within a temperature range of 15 to 80° C., for the two optical members adhered together in step iii), to fully cure the composition.

20. A method of manufacturing a laminate body, comprising the following steps:
i) arranging the curable silicone composition according to claim 8, comprising at least (c1) the hydrosilylation catalyst that exhibits activity without irradiating with a high energy beam, on one or two surfaces of at least one member of two optical members;
ii) promoting a hydrosilylation reaction of the composition disposed in step i) within a temperature range of 15 to 80° C. to bring the composition into a non-fluid, semi-cured state;
iii) adhering together the two optical members via the curable silicone composition in the non-fluid, semi-cured state after step ii); and
iv) further promoting the hydrosilylation reaction of the composition in the non-fluid, semi-cured state within a temperature range of 15 to 80° C. for the two optical members adhered together in step iii), to fully cure the composition.

* * * * *